US012213356B2

(12) United States Patent
Wei et al.

(10) Patent No.: US 12,213,356 B2
(45) Date of Patent: Jan. 28, 2025

(54) DISPLAY SUBSTRATES AND DISPLAY DEVICES

(71) Applicants: Chengdu BOE Optoelectronics Technology Co., Ltd., Sichuan (CN); BOE Technology Group Co., Ltd., Beijing (CN)

(72) Inventors: Bo Wei, Beijing (CN); Yao Huang, Beijing (CN); Feng Wei, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/771,170

(22) PCT Filed: May 31, 2021

(86) PCT No.: PCT/CN2021/097448
§ 371 (c)(1),
(2) Date: Apr. 22, 2022

(87) PCT Pub. No.: WO2022/252064
PCT Pub. Date: Dec. 8, 2022

(65) Prior Publication Data
US 2024/0155890 A1    May 9, 2024

(51) Int. Cl.
*H10K 59/13* (2023.01)
*H10K 59/131* (2023.01)

(52) U.S. Cl.
CPC .................. *H10K 59/131* (2023.02)

(58) Field of Classification Search
CPC ............................ H01L 21/486; H10K 59/131
(Continued)

(56) References Cited

U.S. PATENT DOCUMENTS

| 2016/0189591 A1 | 6/2016 | Yoon et al. |
| 2018/0190750 A1 | 7/2018 | Choi et al. |

(Continued)

FOREIGN PATENT DOCUMENTS

| CN | 107204352 A | 9/2017 | |
| CN | 109859690 A * | 6/2019 | ........... H10K 59/131 |

(Continued)

OTHER PUBLICATIONS

PCT/CN2021/097448 international search report and written opinion.

(Continued)

*Primary Examiner* — Phuc T Dang
(74) *Attorney, Agent, or Firm* — IPro, PLLC

(57) ABSTRACT

A display substrate (1) and a display device, which can reduce the number of power lines (22), and improve the light transmittance of a first display sub-region (111). The display substrate (1) includes a first display sub-region (111) and a second display sub-region (112), where a light transmittance of the first display sub-region (111) is higher than that of the second display sub-region (112); the display substrate (1) includes: a plurality of first-type sub-pixels (21) and a plurality of power lines (22), where the first-type sub-pixels (21) and the power lines (22) are located in the first display sub-region (111); the first-type sub-pixels (21) are arranged in an array along a row direction (X) and a column direction (Y); each first-type sub-pixel (21) comprises a light emitting element and a pixel circuit for driving the light emitting element to emit light; the plurality of power lines (22) are connected to one another; the plurality of power lines (22) comprise at least one of first-type power lines (221) or second-type power lines (222), the first-type power lines (221) are configured to be connected to pixel circuits of the first-type sub-pixels (21) arranged along the row direction (Continued)

(X), and the second-type power lines (222) are configured to be connected to pixel circuits of the first-type sub-pixels (21) arranged in the column direction (Y); a sum of a number of the first-type power lines (221) and a number of the second-type power lines (222) is smaller than a sum of a number of rows and a number of columns of the array.

20 Claims, 19 Drawing Sheets

(58) Field of Classification Search
USPC .......................................................... 257/91
See application file for complete search history.

(56) References Cited

U.S. PATENT DOCUMENTS

| | | | |
|---|---|---|---|
| 2021/0020704 A1 | 1/2021 | Kim | |
| 2021/0064087 A1 | 3/2021 | Ma et al. | |
| 2021/0265430 A1 | 8/2021 | Chang et al. | |
| 2021/0313405 A1 | 10/2021 | Xu et al. | |
| 2021/0327967 A1 | 10/2021 | Zhang et al. | |

FOREIGN PATENT DOCUMENTS

| | | | | |
|---|---|---|---|---|
| CN | 209056269 U | | 7/2019 | |
| CN | 110288915 A | | 9/2019 | |
| CN | 110400535 A | | 11/2019 | |
| CN | 110444125 A | | 11/2019 | |
| CN | 110648622 A | | 1/2020 | |
| CN | 110728921 A | | 1/2020 | |
| CN | 110767097 A | | 2/2020 | |
| CN | 110767141 A | | 2/2020 | |
| CN | 110767662 A | * | 2/2020 | ........... H01L 27/124 |
| CN | 111180483 A | | 5/2020 | |
| CN | 111489681 A | | 8/2020 | |
| CN | 111697025 A | | 9/2020 | |
| CN | 111833791 A | | 10/2020 | |
| CN | 112002726 A | | 11/2020 | |
| CN | 112242419 A | | 1/2021 | |
| CN | 112750390 A | | 5/2021 | |
| EP | 3745463 A2 | | 12/2020 | |
| IN | 111446262 A | | 7/2020 | |
| JP | 2010054527 A | | 3/2010 | |
| JP | 2010096793 A | | 4/2010 | |
| KR | 20150002254 A | | 1/2015 | |
| WO | 2020258861 A1 | | 12/2020 | |

OTHER PUBLICATIONS

EP219434404 extended European search report.
CN202180001369.2—First Office Action mailed on Oct. 24, 2024, 24 pages.

* cited by examiner

DISPLAY SUBSTRATES AND DISPLAY DEVICES

CROSS-REFERENCE TO RELATED APPLICATIONS

The present application is a U.S. National Phase of International Application No. PCT/CN2021/097448, entitled "SPLICING DISPLAY UNIT AND DISPLAY SCREEN", and filed on May 31, 2021. The entire contents of each of the above-listed applications are hereby incorporated by reference for all purposes.

TECHNICAL FIELD

The present application relates to the field of display technologies, and in particular, to display substrates and display devices.

BACKGROUND

In the related art, Organic Light Emitting Diode (OLED) display substrates have a wide range of applications in fields of smart phones, televisions, VR (Virtual Reality) devices, wearable devices, etc. due to their excellent display effect, and characteristics such as thinness, flexibility, excellent shock resistance, and suitability for wearable products. As requirements on screen-to-body ratios of display substrates of terminal devices with cameras, such as mobile phones, is getting higher and higher, disposing the cameras under the display substrates is one of the best solutions to meet such requirements. However, disposing the cameras under the display substrates places higher requirements on the performance of the display substrates, especially on their light transmittance. High light transmittance of regions for enabling the cameras to capture images on the display substrates is a basic condition for applying this solution. Therefore, how to improve the light transmittance of the display substrates is a technical problem that needs to be solved.

SUMMARY

The present disclosure provides display substrates and display devices.

According to a first aspect of examples of the present disclosure, there is provided a display substrate, including: a display region including a first display sub-region and a second display sub-region, where a light transmittance of the first display sub-region is higher than that of the second display sub-region; the display substrate further including: a plurality of first-type sub-pixels and a plurality of power lines, where the plurality of first-type sub-pixels and the plurality of power lines are located in the first display sub-region; the plurality of first-type sub-pixels are arranged in an array along a row direction and a column direction; a first-type sub-pixel includes a light emitting element and a pixel circuit for driving the light emitting element to emit light; the plurality of power lines are connected to one another; the plurality of power lines include at least one type of first-type power lines or second-type power lines, the first-type power lines are configured to be connected to pixel circuits of the first-type sub-pixels arranged in the row direction, and the second-type power lines are configured to be connected to pixel circuits of the first-type sub-pixels arranged in the column direction; a sum of a number of the first-type power lines and a number of the second-type power lines is smaller than a sum of a number of rows and a number of columns of the array.

In an example, the plurality of first-type sub-pixels are divided into a plurality of sub-pixel groups, and a sub-pixel group includes at least one of: at least two adjacent first-type sub-pixels in the row direction or at least two adjacent first-type sub-pixels in the column direction.

In an example, a sub-pixel group includes two adjacent first-type sub-pixels in the row direction and two adjacent first-type sub-pixels in the column direction.

In an example, in a same row of sub-pixel groups, a distance between two adjacent sub-pixel groups is higher than or equal to a width of the sub-pixel group in the row direction;

in a same column of sub-pixel groups, a distance between two adjacent sub-pixel groups is higher than or equal to a length of the sub-pixel group in the column direction.

In an example, orthographic projections of sub-pixel groups in an $(i+2)^{th}$ row on sub-pixel groups in an $i^{th}$ row are located outside orthographic projections of sub-pixel groups in an $(i+1)^{th}$ row on the sub-pixel groups in the $i^{th}$ row, orthographic projections of sub-pixel groups in an $(i+3)^{th}$ row on the sub-pixel groups in the $i^{th}$ row overlaps the orthographic projections of sub-pixel groups in the $(i+1)^{th}$ row on the sub-pixel groups in the $i^{th}$ row, and the orthographic projections of sub-pixel groups in the $(i+3)^{th}$ row on the sub-pixel groups in the $i^{th}$ row are located outside the orthographic projections of sub-pixel groups in the $(i+2)^{th}$ row on the sub-pixel groups in the $i^{th}$ row, where i is a positive integer;

orthographic projections of sub-pixel groups in a $(j+2)^{th}$ column on sub-pixel groups in a $j^{th}$ column are located outside orthographic projections of sub-pixel groups in a $(+1)^{th}$ column on the sub-pixel groups in the $j^{th}$ column, orthographic projections of sub-pixel groups in a $(j+3)^{th}$ column on the sub-pixel groups in the $j^{th}$ column overlaps the orthographic projections of sub-pixel groups in the $(j+1)^{th}$ column on the sub-pixel groups in the $j^{th}$ column, and the orthographic projections of sub-pixel groups in the $(j+3)^{th}$ column on the sub-pixel groups in the $j^{th}$ column are located outside the orthographic projections of sub-pixel groups in the $(j+2)^{th}$ column on the sub-pixel groups in the $j^{th}$ column, where j is a positive integer.

In an example, the number of the first-type power lines is smaller than the number of rows of the array.

In an example, the number of the first-type power lines is equal to 0.25 time the number of rows of the array, pixel circuits of first-type sub-pixels in a same sub-pixel group are connected to just a same first-type power line, and the same first-type power line is connected to pixel circuits of first-type sub-pixels in sub-pixel groups in two adjacent rows.

In an example, the number of the second-type power lines is smaller than the number of columns of the array.

In an example, the number of the second-type power lines is equal to 0.5 time the number of columns of the array, and the number of the second-type power lines is equal to a number of columns of the sub-pixel groups;

pixel circuits of first-type sub-pixels in sub-pixel groups in a same column are connected to a same second-type power line.

In an example, a first-type power line exists between pixel circuits of first-type sub-pixels in sub-pixel groups in two adjacent rows, and the pixel circuits of the first-type sub-pixels in the sub-pixel groups in two adjacent rows are connected to a same first-type power line; pixel circuits of first-type sub-pixels in a same sub-pixel group are connected to two adjacent first-type power lines.

In an example, the number of the second-type power lines is 0.

In an example, the plurality of power lines further include third-type power lines, and the third-type power lines are connected to at least one type of the first-type power lines or the second-type power lines;

a number of the third-type power lines is the same as a number of the sub-pixel groups, and pixel circuits of first-type sub-pixels in a sub-pixel group are connected to a same third-type power line.

In an example, the third-type power lines have a ring shape.

In an example, when the third-type power lines are connected to the first-type power lines and the second-type power lines, the third-type power lines include first conductive portions and second conductive portions, the first conductive portions are connected to the second conductive portions, the first conductive portions extend along the row direction, and the second conductive portions extend along the column direction; the first-type power lines include third conductive portions, and the third conductive portions extend along the row direction; the second-type power lines extend along the column direction; the first conductive portions are connected to the third conductive portions, and the second-type power lines are connected to the first conductive portions or the second conductive portions;

when the third-type power lines are connected to the first-type power lines, the third-type power lines include first conductive portions, and the first conductive portions extend along the row direction; the first-type power lines include third conductive portions, and the third conductive portions extend along the row direction; the first conductive portions are connected to the third conductive portions.

In an example, a sub-pixel group includes three adjacent first-type sub-pixels in the row direction.

In an example, the number of the first-type power lines is equal to the number of rows of the array;

pixel circuits of first-type sub-pixels in sub-pixel groups in a same row are connected to just a same first-type power line, and the same first-type power line is connected to just pixel circuits of first-type sub-pixels in sub-pixel groups in a same row.

In an example, the number of the second-type power lines is smaller than the number of columns of the array.

In an example, the number of the second-type power lines is equal to ⅓ times the number of columns of the array, and the number of the second-type power lines is equal to a number of columns of the sub-pixel groups;

pixel circuits of first-type sub-pixels in sub-pixel groups in a same column are connected to a same second-type power line, and the same second-type power line is connected to pixel circuits of first-type sub-pixels in sub-pixel groups in a same column.

In an example, the second display sub-region includes a plurality of second-type sub-pixels, and the plurality of second-type sub-pixels are arranged in an array along the row direction and the column direction;

a density of the first-type sub-pixels in the first display sub-region is smaller than that of the second-type sub-pixels in the second display sub-region.

In an example, the plurality of power lines further include fourth power lines and fifth power lines, the fourth power lines are configured to be connected to pixel circuits of the second-type sub-pixels arranged along the row direction, and the fifth power lines are configured to be connected to pixel circuits of the second-type sub-pixels arranged along the column direction;

a density of the power lines in the first display sub-region is smaller than that in the second display sub-region.

According to a second aspect of the examples of the present disclosure, there is provided a display device, including the above-described display substrate and photosensitive elements, where projections of the photosensitive elements on the display substrate are located within a first display sub-region.

DETAILED DESCRIPTION OF THE EMBODIMENTS

In order to make the above objectives, features and advantages of the present disclosure more clearly understood, specific examples of the present disclosure will be described in detail below with reference to the accompanying drawings.

Figure 1:
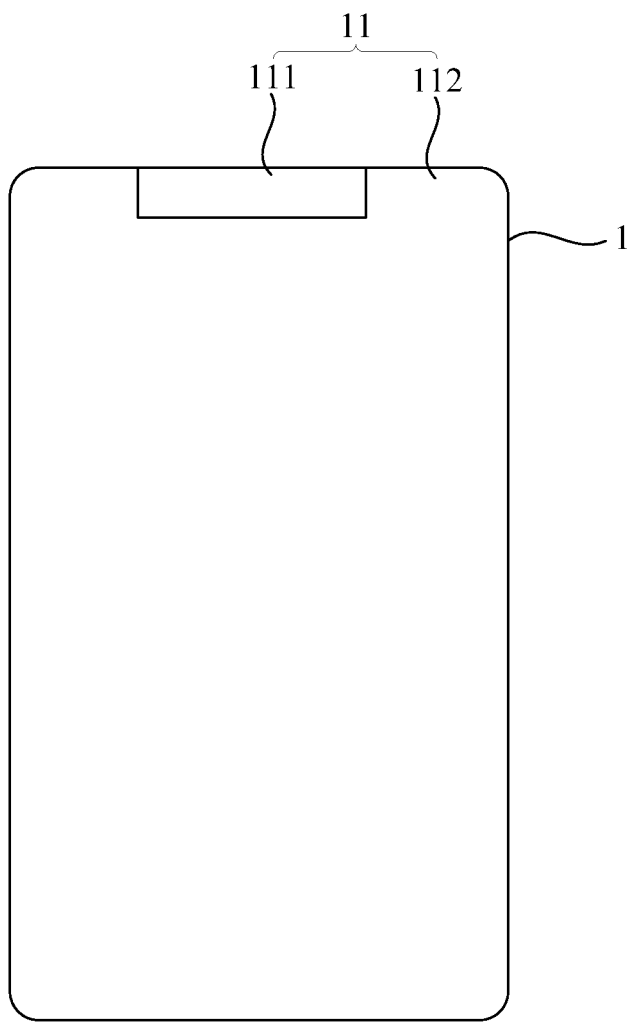
FIG. 1 is a schematic structural diagram illustrating a display substrate according to an example of the present disclosure.

An example of the present disclosure provides a display substrate. A display substrate 1, as shown in FIG. 1, includes a display region 11. The display region 11 includes a first display sub-region 111 and a second display sub-region 112. A light transmittance of the first display sub-region 111 is higher than that of the second display sub-region 112.

In this example, as shown in FIGS. 2 to 12, the display substrate 1 includes: a plurality of first-type sub-pixels 21 and a plurality of power lines VDD.

In this example, the plurality of first-type sub-pixels 21 and the plurality of power lines VDD are located in the first display sub-region 111. The plurality of first-type sub-pixels 21 are arranged in an array along a row direction X and a column direction Y. The first-type sub-pixel 21 includes a light emitting element and a pixel circuit for driving the light emitting element to emit light. A plurality of power lines 22 are connected to one another. The plurality of power lines 22 include at least one type of first-type power lines 221 or second-type power lines 222. The first-type power lines 221 are configured to be connected to pixel circuits of the first-type sub-pixels 21 arranged along the row direction X. The second-type power lines 222 are configured to be connected to pixel circuits of the first-type sub-pixels 21 arranged along the column direction Y A sum of a number of the first-type power lines 221 and a number of the second-type power lines 222 is smaller than a sum of a number of rows and a number of columns of the array.

In this example, the plurality of power lines in the first display sub-region 111 include at least one type of the first-type power lines 221 or the second-type power lines 222, and the sum of the number of the first-type power lines 221 and the number of the second-type power lines 222 is smaller than the sum of the number of rows and the number of columns of the array formed by the first-type sub-pixels 21, where the first-type power lines 221 are configured to be connected to the pixel circuits of the first-type sub-pixels 21 arranged along the row direction X, and the second-type power lines 222 are configured to be connected to the pixel circuits of the first-type sub-pixels 21 arranged along the column direction Y Therefore, there is at least one row of first-type sub-pixels 21 near which no first-type power lines 221 are disposed, and there is at least one column of first-type sub-pixels 21 near which no second-type power lines 222 are disposed, which can reduce the number and the occupied area of the power lines, and can be beneficial to improve the light transmittance of the first display sub-region 111.

The display substrate provided by examples of the present disclosure has been briefly introduced above. The display substrate provided by the examples of the present disclosure will be described in detail below.

An example of the present disclosure provides a display substrate. As shown in FIG. 1, the display substrate includes a display region. The display region includes a first display sub-region 111 and a second display sub-region 112. A light transmittance of the first display sub-region 111 is higher than that of the second display sub-region 112.

Figure 2:
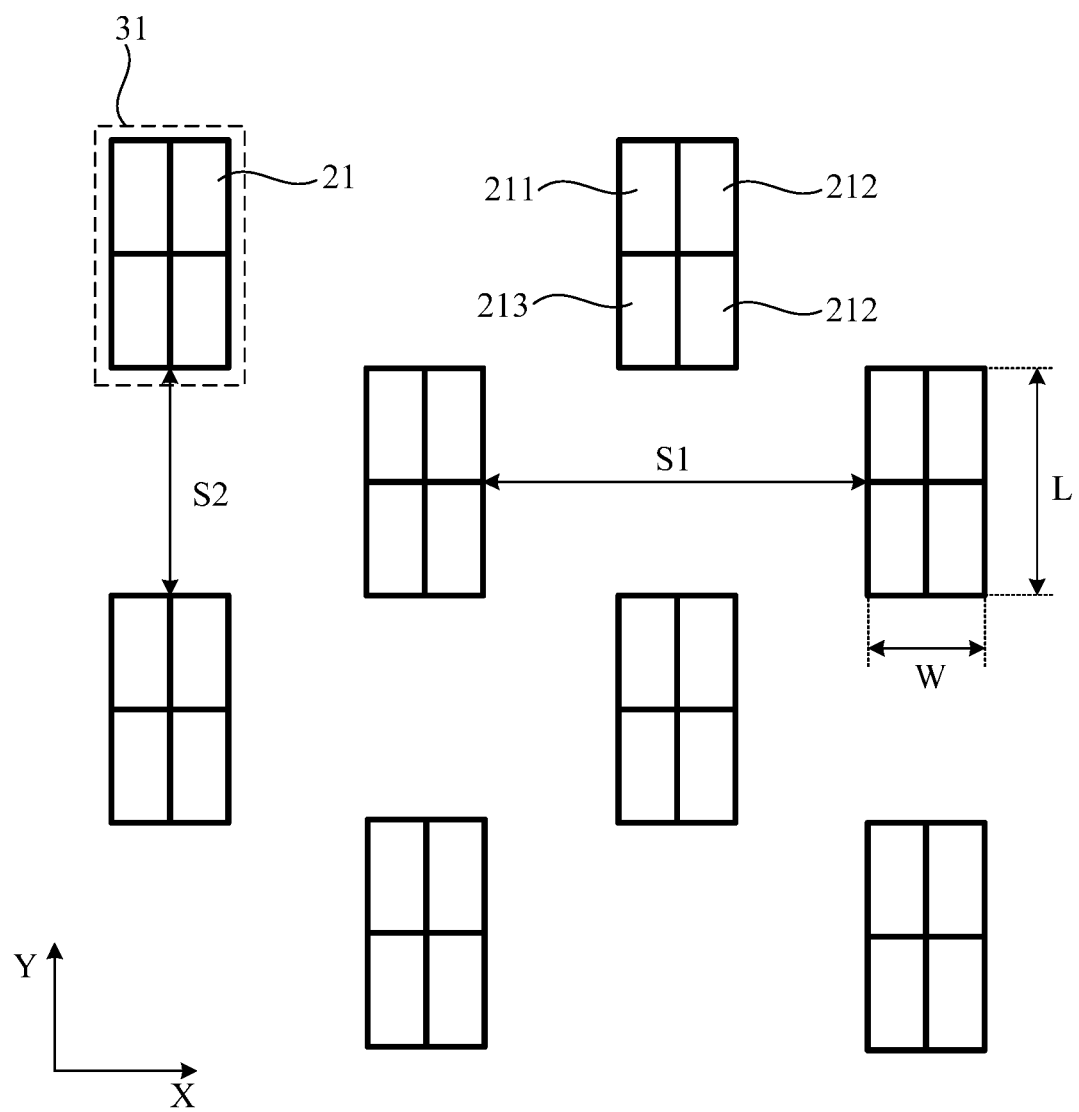
FIG. 2 is a schematic structural diagram illustrating another display substrate according to an example of the present disclosure.
Figure 3:
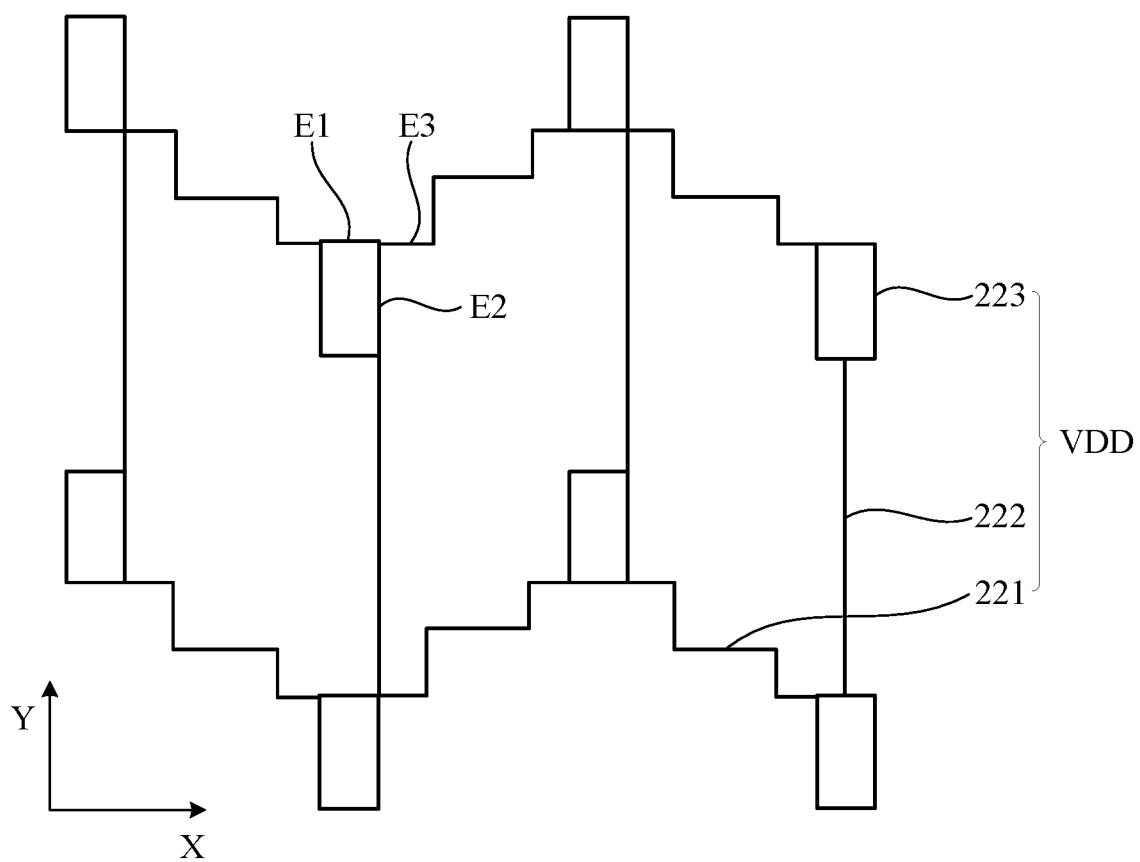
FIG. 3 is a schematic structural diagram illustrating another display substrate according to an example of the present disclosure.
Figure 4:
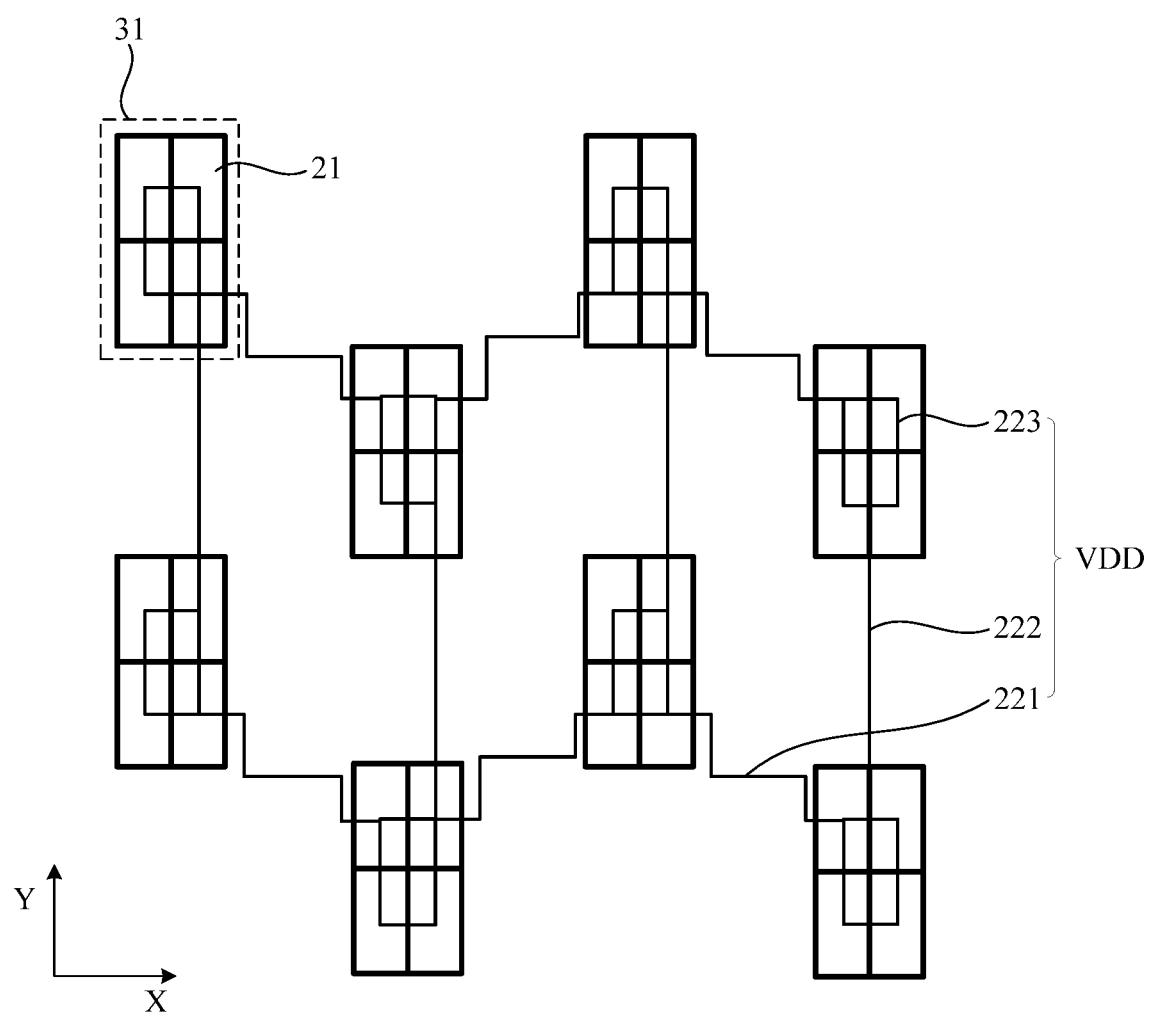
FIG. 4 is a schematic structural diagram illustrating another display substrate according to an example of the present disclosure.

In this example, as shown in FIGS. 2 to 4, the display substrate includes a plurality of first-type sub-pixels 21 and a plurality of power lines 22. The plurality of first-type sub-pixels 21 and the plurality of power lines 22 are located in the first display sub-region 111.

In this example, as shown in FIGS. 2 and 4, the plurality of first-type sub-pixels 21 are arranged in an array along a row direction X and a column direction Y Each first-type sub-pixel 21 includes a light emitting element and a pixel circuit for driving the light emitting element to emit light. The pixel circuit may include transistors, and may further include capacitors. The pixel circuit may be a 1T pixel circuit, a 2T1C pixel circuit, a 3T1C pixel circuit, a 4T1C pixel circuit, a 5T1C pixel circuit, or a 7T1C pixel circuit. In this example, the 7T1C pixel circuit will be taken as an example for illustration.

In this example, as shown in FIGS. 2 and 4, the plurality of first-type sub-pixels 21 are divided into a plurality of sub-pixel groups 31, and each sub-pixel group 31 includes two adjacent first-type sub-pixels 21 in the row direction X, and two adjacent first-type sub-pixels 21 in the column direction Y That is, each sub-pixel group 31 includes four first-type sub-pixels 21.

In this example, as shown in FIG. 2, each sub-pixel group 31 includes one red sub-pixel 211, two green sub-pixels 212 and one blue sub-pixel 213. In each sub-pixel group 31, the red sub-pixel 211 and the blue sub-pixel 213 may be located in the same column, and the two green sub-pixels 212 may be located in the same column, but they are not limited thereto.

In this example, the second display sub-region 112 includes a plurality of second-type sub-pixels, and the plurality of second-type sub-pixels are arranged in an array along the row direction X and the column direction Y A density of the first-type sub-pixels 21 in the first display sub-region 111 is smaller than that of the second-type sub-pixels in the second display sub-region 112. For example, the density of the first-type sub-pixels 21 in the first display sub-region 111 may be ½ of that of the second-type sub-pixels in the second display sub-region 112.

In this example, as shown in FIG. 2, in the same row of sub-pixel groups 31, a distance S1 between two adjacent sub-pixel groups 31 is higher than a width W of the sub-pixel group 31 in the row direction X. However, in other examples, in the same row of sub-pixel groups 31, the distance S1 between two adjacent sub-pixel groups 31 may be equal to the width W of the sub-pixel group 31 in the row direction X. In this way, the light transmittance of the first display sub-region 111 can be improved.

In this example, as shown in FIG. 2, in the same column of sub-pixel groups 31, a distance S2 between two adjacent sub-pixel groups 31 is equal to a length L of the sub-pixel group 31 in the column direction Y In other examples, in the same column of sub-pixel groups 31, the distance S2 between two adjacent sub-pixel groups 31 may be higher than the length L of the sub-pixel group 31 in the column direction Y In this way, the light transmittance of the first display sub-region 111 can be improved.

In this example, as shown in FIGS. 2 and 4, orthographic projections of sub-pixel groups 31 in an $(i+2)^{th}$ row on sub-pixel groups 31 in an $i^{th}$ row are located outside orthographic projections of sub-pixel groups 31 in an $(i+1)^{th}$ row on the sub-pixel groups 31 in the it row, orthographic projections of sub-pixel groups 31 in an $(i+3)^{th}$ row on the sub-pixel groups 31 in the $i^{th}$ row overlaps the orthographic projections of sub-pixel groups 31 in the $(i+1)^{th}$ row on the sub-pixel groups 31 in the it row, and the orthographic projections of sub-pixel groups 31 in the $(i+3)^{th}$ row on the sub-pixel groups 31 in the $i^{th}$ row are located outside the orthographic projections of sub-pixel groups 31 in the $(i+2)^{th}$ row on the sub-pixel groups 31 in the $i^{th}$ row, where i is a positive integer.

For example, when i is 1, orthographic projections of sub-pixel groups 31 in a third row on sub-pixel groups 31 in a first row are located outside orthographic projections of sub-pixel groups 31 in a second row on the sub-pixel groups 31 in the first row, orthographic projections of sub-pixel groups 31 in a fourth row on the sub-pixel groups 31 in the first row overlaps the orthographic projections of sub-pixel groups 31 in the second row on the sub-pixel groups 31 in the first row, and the orthographic projections of sub-pixel groups 31 in the fourth row on the sub-pixel groups 31 in the first row are located outside the orthographic projections of sub-pixel groups 31 in the third row on the sub-pixel groups 31 in the first row.

In this example, as shown in FIGS. 2 and 4, orthographic projections of sub-pixel groups 31 in a $(j+2)^{th}$ column on sub-pixel groups 31 in a $j^{th}$ column are located outside orthographic projections of sub-pixel groups 31 in a $(j+1)^{th}$ column on the sub-pixel groups 31 in the $j^{th}$ column, orthographic projections of sub-pixel groups 31 in a (j+3) t column on the sub-pixel groups 31 in the $j^{th}$ column overlaps the orthographic projections of sub-pixel groups 31 in the $(j+1)^{th}$ column on the sub-pixel groups 31 in the $j^{th}$ column, and the orthographic projections of sub-pixel groups 31 in the $(j+3)^{th}$ column on the sub-pixel groups 31 in the $j^{th}$ column are located outside the orthographic projections of sub-pixel groups 31 in the $(j+2)^{th}$ column on the sub-pixel groups 31 in the $j^{th}$ column, where j is a positive integer.

For example, when j is 1, orthographic projections of sub-pixel groups 31 in a third column on sub-pixel groups 31 in a first column are located outside orthographic projections of sub-pixel groups 31 in a second column on the sub-pixel groups 31 in the first column, orthographic projections of sub-pixel groups 31 in a fourth column on the sub-pixel groups 31 in the first column overlaps the orthographic projections of sub-pixel groups 31 in the second column on the sub-pixel groups 31 in the first column, and the orthographic projections of sub-pixel groups 31 in the fourth column on the sub-pixel groups 31 in the first column are located outside the orthographic projections of sub-pixel groups 31 in the third column on the sub-pixel groups 31 in the first column.

In this example, as shown in FIGS. 3 and 4, the plurality of power lines 22 are connected to one another. In this way, a resistance of the power lines can be reduced, and further, a voltage drop of power supply voltages in the column direction Y can be decreased.

In this example, as shown in FIGS. 3 and 4, the plurality of power lines 22 include first-type power lines 221, second-type power lines 222 and third-type power lines 223. The first-type power lines 221, the second-type power lines 222 and the third-type power lines 223 are located in the first display sub-region 111.

In this example, as shown in FIGS. 3 and 4, the first-type power lines 221 are configured to be connected to pixel circuits of the first-type sub-pixels 21 arranged along the row direction X. In this example, a number of the first-type power lines 221 is smaller than a number of rows of the array, the number of the first-type power lines 221 is equal to 0.25 time the number of rows of the array, and the number of the first-type power lines 221 is equal to 0.5 time a number of rows of the sub-pixel groups 31. For example, in FIG. 2, 8 rows of first-type sub-pixels 21 and 4 rows of sub-pixel groups 31 are shown, and the number of first-type power lines 221 is 2.

In this example, as shown in FIG. 4, pixel circuits of four first-type sub-pixels 21 in the same sub-pixel group 31 are connected to just the same first-type power line 221, and the same first-type power line 221 is connected to pixel circuits of first-type sub-pixels 21 in sub-pixel groups 31 in two adjacent rows, that is, the same first-type power line 221 is connected to pixel circuits of first-type sub-pixels 21 in four adjacent rows.

In this example, as shown in FIG. 4, the second-type power lines 222 are configured to be connected to pixel circuits of the first-type sub-pixels 21 arranged along the column direction Y In this example, a number of the second-type power lines 222 is smaller than a number of columns of the array, the number of the second-type power lines 222 is equal to 0.5 time the number of columns of the array, and the number of the second-type power lines 222 is equal to a number of columns of the sub-pixel groups 31. For example, in FIG. 4, 8 columns of first-type sub-pixels 21 and 4 columns of sub-pixel groups 31 are shown, and the number of second-type power lines 222 is 4.

In this example, as shown in FIGS. 3 and 4, pixel circuits of four first-type sub-pixels 21 in sub-pixel groups 31 in the same column are connected to the same second-type power line 222. The same second-type power line 222 is connected to pixel circuits of four first-type sub-pixels 21 in sub-pixel groups 31 in the same column.

In this example, as shown in FIGS. 3 and 4, the third-type power lines 223 are connected to the first-type power lines 221 and the second-type power lines 222, and a number of the third-type power lines 223 is the same as a number of the sub-pixel groups 31. Pixel circuits of four first-type sub-pixels 21 in each sub-pixel group 31 are connected to the same third-type power line 223. The third-type power lines 223 may have a ring shape, for example, a rectangular ring shape, but they are not limited thereto.

In this example, as shown in FIG. 3, the third-type power line 223 includes a first conductive portion E1 and a second conductive portion E2. The first conductive portion E1 is connected to the second conductive portion E2. The first conductive portion E1 extends along the row direction X, and the second conductive portion E2 extends along the column direction Y.

In this example, as shown in FIG. 3, the first-type power line 221 includes a third conductive portion E3. The third conductive portion E3 extends along the row direction X, and the second-type power line 222 extends along the column direction Y. For some third-type power lines 223, for example, the second third-type power line 223 from the left in FIG. 3, the first conductive portion E1 is connected to the third conductive portion E3, and a second-type power line 222 is connected to the second conductive portion E2. For some other third-type power lines 223, for example, the third-type power line 223 on the rightmost in FIG. 3, the first conductive portion E1 is connected to a second-type power line 222.

In this example, a sum of the number of the first-type power lines 221 and the number of the second-type power lines 222 is smaller than a sum of the number of rows and the number of columns of the array. Therefore, there is at least one row of first-type sub-pixels 21 near which no first-type power lines 221 are disposed, and at least one column of first-type sub-pixels 21 near which no second-type power lines 222 are disposed, which reduces the number and an occupied area of the power lines, and is beneficial to improve the light transmittance of the first display sub-region 111.

In this example, the plurality of power lines 22 further include fourth power lines and fifth power lines. The fourth power lines and the fifth power lines may be located in the second display sub-region 112. The first-type power lines 221, the second-type power lines 222, the third-type power lines 223, the fourth power lines, and the fifth power lines are connected to one another.

In this example, the fourth power lines are configured to be connected to pixel circuits of the second-type sub-pixels arranged along the row direction X, and the fifth power lines are configured to be connected to pixel circuits of the second-type sub-pixels arranged along the column direction Y.

In this example, in the second display sub-region, a number of the fourth power lines is the same as a number of rows of the array. Pixel circuits of second-type sub-pixels in the same row are connected to the same fourth power line, and the same fourth power line is connected to pixel circuits of second-type sub-pixels in the same row.

In this example, in the second display sub-region, a number of the fifth source lines is the same as a number of columns of the array. Pixel circuits of second-type sub-pixels in the same column are connected to the same fifth power line, and the same fifth power line is connected to pixel circuits of second-type sub-pixels in the same column.

In this example, a density of the power lines in the first display sub-region 111 is smaller than that in the second display sub-region 112. Since the density of the power lines in the first display sub-region 111 is smaller than that in the second display sub-region 112, the light transmittance of the first display sub-region 111 can be improved.

A structure of the display substrate in this example has been shown above briefly in FIGS. 2-4. The structure of the display substrate in the example will be further described below.

Figure 5:
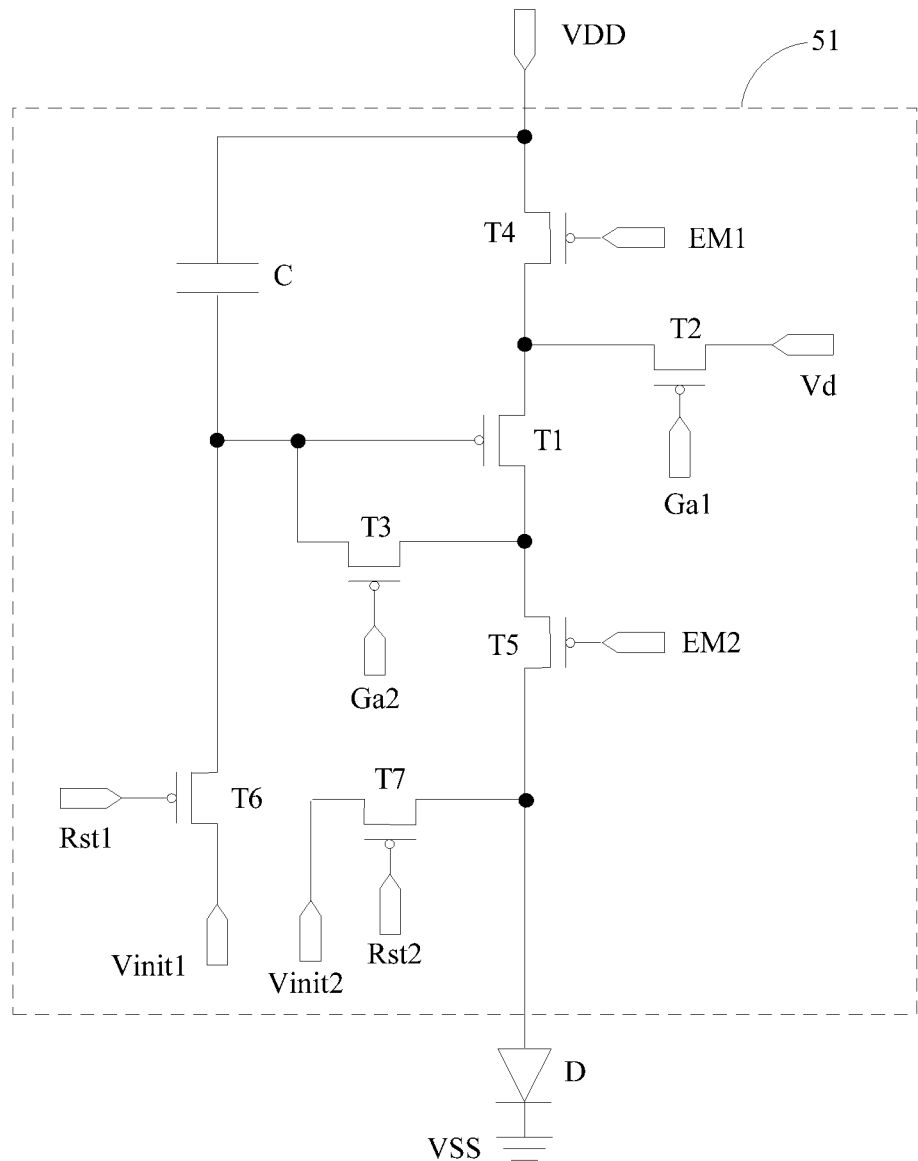
FIG. 5 is a schematic structural diagram illustrating an equivalent circuit of a pixel circuit according to an example of the present disclosure.

A structure of a pixel circuit will be first introduced. As shown in FIG. 5, a pixel circuit 51 is connected to a light emitting element D for driving the light emitting element D to emit light. The pixel circuit 51 is connected to a power line VDD, and a negative electrode of the light emitting element D is connected to a power line VSS.

As shown in FIG. 5, the pixel circuit 51 may include a drive transistor T1, a data writing transistor T2, a threshold compensation transistor T3, a second light emission control transistor T4, a first light emission control transistor T5, a first reset transistor T6, a second reset transistor T7 and a storage capacitor C. The threshold compensation transistor T3 and the first reset transistor T6 may be double-gate transistors.

In this example, the drive transistor T1 is used to provide a drive current for the light emitting element D. A gate electrode of the drive transistor T1 is connected to a first electrode of the capacitor C, a first electrode of the threshold compensation transistor T3, and a second electrode of the first reset transistor T6. A first electrode of the drive transistor T1 is connected to a second electrode of the threshold compensation transistor T3 and a second electrode of the first light emission control transistor T5. A second electrode of the drive transistor T1 is connected to a first electrode of the second light emission control transistor T4 and a second electrode of the data writing transistor T2. A first electrode of the data writing transistor T2 is configured to be electrically connected to a data line Vd to receive data signals. A gate electrode of the data writing transistor T2 is electrically connected to a first scan signal line Ga1 to receive scan signals, and the first electrode of the data writing transistor T2 is electrically connected to the data line Vd to receive the data signals. A gate electrode of the threshold compensation transistor T3 is electrically connected to a second scan signal line Ga2 to receive compensation control signals. A gate electrode of the second light emission control transistor T4 is electrically connected to a first light emission control signal line EM1 to receive first light emission control signals, and a second electrode of the second light emission control transistor T4 is connected to a second electrode of the capacitor and the power line VDD. A gate electrode of the first light emission control transistor T5 is electrically connected to a second light emission control signal line EM2 to receive second light emission control signals, and a first electrode of the first light emission control transistor T5 is connected to a first electrode of the second reset transistor T7 and a positive electrode of the light emitting element D. A gate electrode of the first reset transistor T6 is electrically connected to a first reset control signal line Rst1 to receive first sub-reset control signals, and a first electrode of the first reset transistor T6 is electrically connected to a first reset power supply terminal Vinit1 to receive first reset signals. A gate electrode of the second reset transistor T7 is electrically connected to a second reset control signal line Rst2 to receive second sub-reset control signals, and a second electrode of the second reset transistor T7 is electrically connected to a second reset power supply terminal Vinit2 to receive second reset signals.

In this example, the drive transistor T1, the data writing transistor T2, the threshold compensation transistor T3, the second light emission control transistor T4, the first light emission control transistor T5, the first reset transistor T6, and the second reset transistor T7 are P-type transistors, their first electrodes are source electrodes, and their second electrodes are drain electrodes. In other examples, one or more of the drive transistor T1, the data writing transistor T2, the threshold compensation transistor T3, the second light emission control transistor T4, the first light emission control transistor T5, the first reset transistor T6, and the second reset transistor T7 may be N-type transistors.

In this example, a voltage of power supply signals provided by the power line VDD is higher than that provided by the power line VSS. The voltage of the power supply signals provided by the power line VDD is a positive voltage, and the voltage of the power supply signals provided by the power line VSS may be 0 or a negative voltage. For example, a voltage of power supply signals provided by the power line VSS when being grounded is 0. However, in other examples, the voltage of the power supply signals provided by the power line VDD may be smaller than that provided by the power line VSS.

In this example, the first light emission control signals may be the same as the second light emission control signals, and the gate electrode of the second light emission control transistor T4 and the gate electrode of the first light emission control transistor T5 may be connected to the same light emission control signal line EM, where the light emission control signal line EM is the first light emission control signal line EM1 or the second light emission control signal line EM2. Similarly, the first sub-reset control signals may be the same as the second sub-reset control signals, and the gate electrode of the first reset transistor T6 and the gate electrode of the second reset transistor T7 may be connected to the same reset control signal line Rst, where the reset control signal line Rst may be the first reset control signal line Rst1 or the second reset control signal line Rst2. When the first reset signals are the same as the second reset signals, the first reset power supply terminal Vinit1 and the second reset power supply terminal Vinit2 are connected to the same reset signal line VINIT.

The structure of a pixel circuit has been described above. Structures of layers of pixel circuits will be described below with reference to FIGS. 6 to 14. FIGS. 6 to 14 show structures of layers of pixel circuits of 4 rows and 6 columns of first-type sub-pixels 21, or structures of layers of pixel circuits of first-type sub-pixels 21 in 2 rows and 3 columns of sub-pixel groups 31.

FIGS. 6 to 11 show structures of an active semiconductor layer 61 in a pixel circuit. The active semiconductor layer 61 may be formed by patterning semiconductor material. The active semiconductor layer 61 may be used to manufacture active layers of drive transistors T1, data writing transistors T2, threshold compensation transistors T3, second light emission control transistors T4, first light emission control transistors T5, first reset transistors T6, and second reset transistors T7. An active semiconductor layer 61 includes active layer patterns and doped region patterns of transistors of the sub-pixels, where a doped region pattern includes a source region and a drain region. Active layer patterns and doped region patterns of transistors in the same pixel circuit are integrally disposed.

As shown in FIGS. 8 to 11, a drive transistor T1 includes an active layer T1C, a source region T1S, and a drain region T1D; a data writing transistor T2 includes an active layer T2C, a source region T2S, and a drain region T2D; a threshold compensation transistor T3 includes an active layer T3C, a source region T3S, and a drain region T3D; a second light emission control transistor T4 includes an active layer T4C, a source region T4S, and a drain region T4D; a first light emission control transistor T5 includes an active layer T5C, a source region T5S, and a drain region T5D; a first reset transistor T6 includes an active layer T6C, a source region T6S, and a drain region T6D; and a second reset transistor T7 includes an active layer T7C, a source region T7S, and a drain region T7D.

It should be noted that an active layer may include an integrally formed low-temperature polysilicon layer, and a source region and a drain region may be subjected to conductor processing by doping or the like to achieve electrical connection between structures. That is, an active semiconductor layer of transistors of each first-type sub-pixel 21 is an overall pattern formed of p-silicon, and each transistor in the same pixel circuit includes a doped region pattern (i.e., a source region and a drain region) and an active layer pattern. Active layers of different transistors are separated by doped structures.

In this example, the active semiconductor layers 61 may be made of amorphous silicon, polysilicon, oxide semiconductor materials, or the like. It should be noted that the source regions and the drain regions may be regions doped with N-type or P-type impurities.

Figure 6:
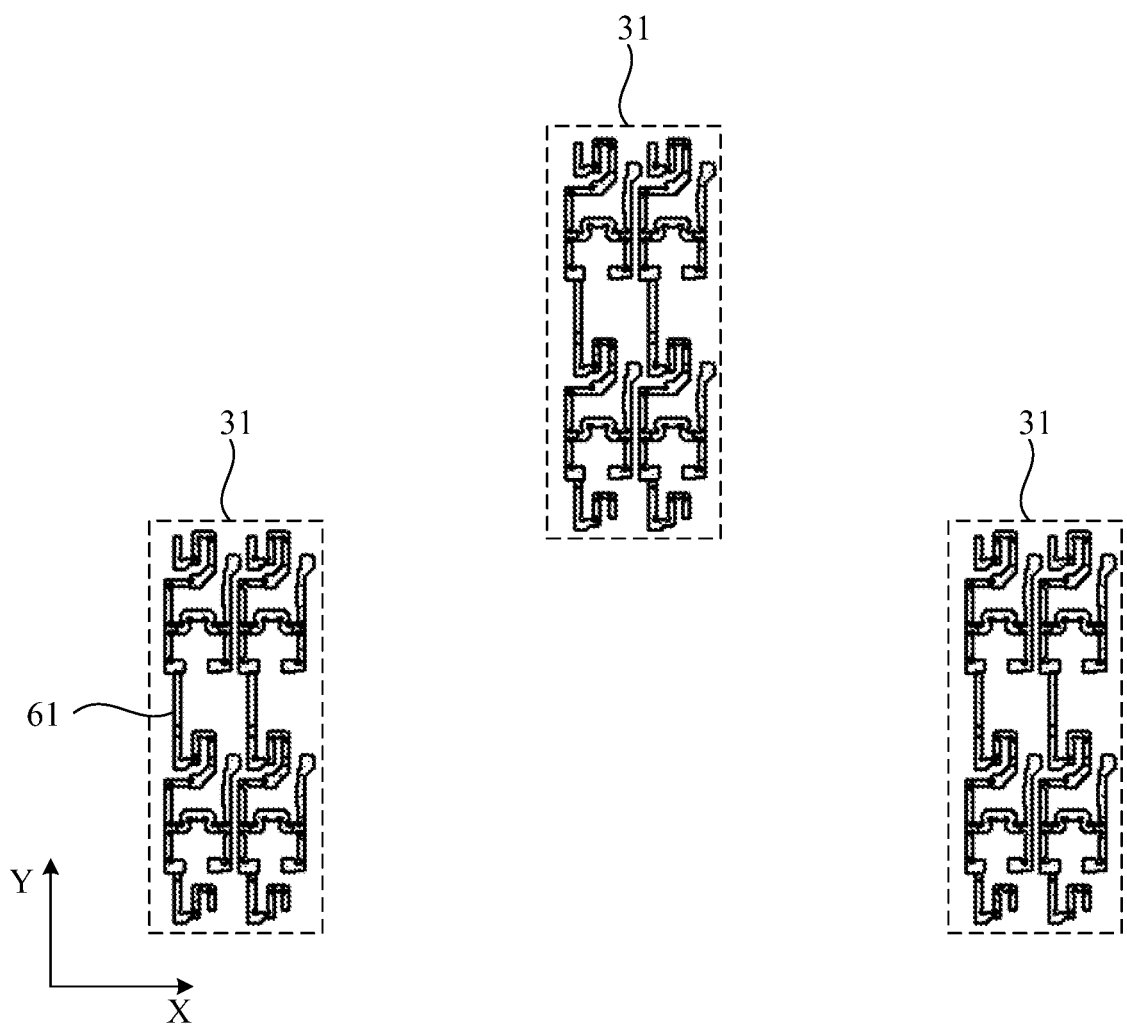
FIGS. 6 to 14 are schematic structural diagrams illustrating layers of a pixel circuit according to an example of the present disclosure.
Figure 7:
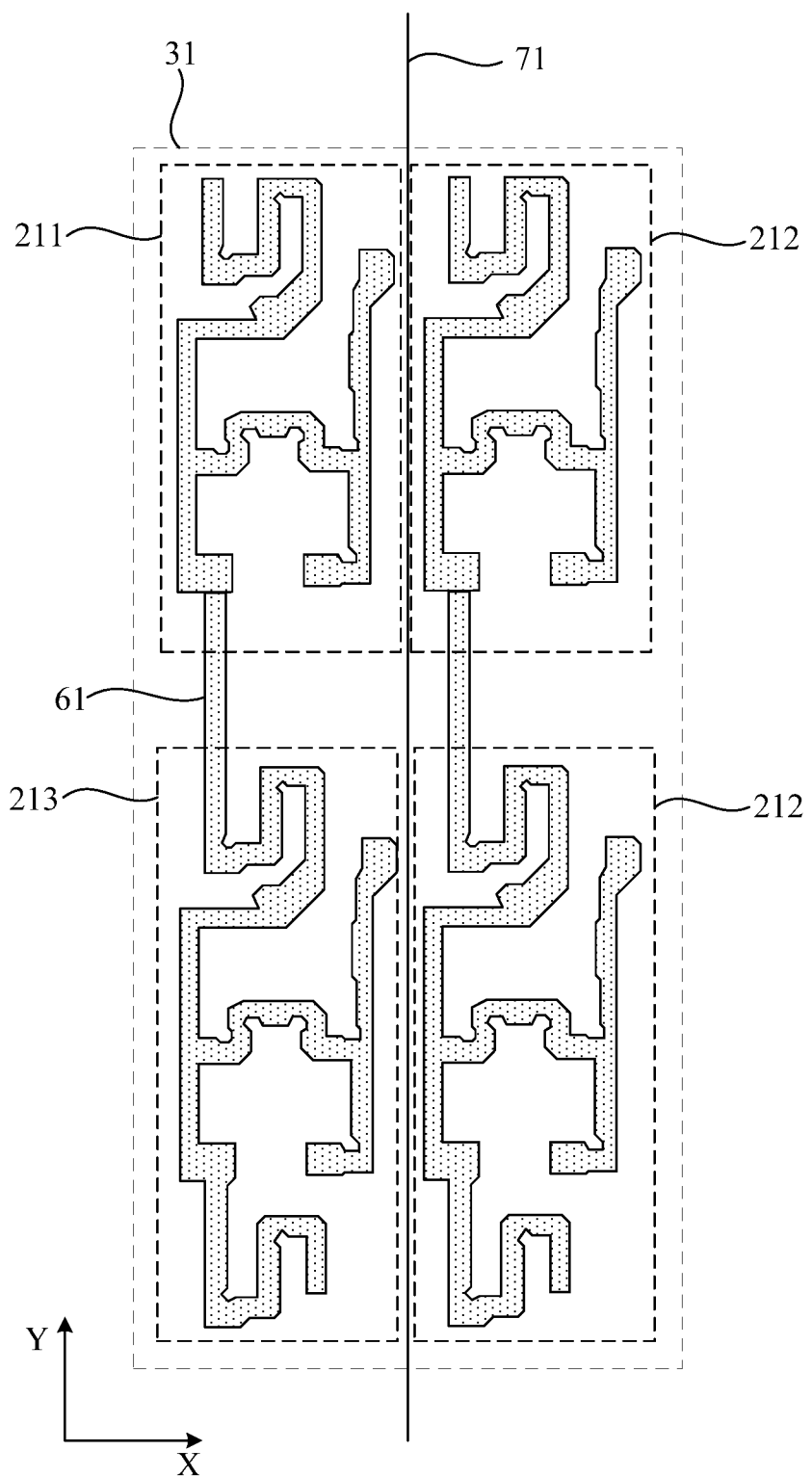

As shown in FIGS. 6 to 7, in each sub-pixel group 31, active semiconductor layers 61 are symmetrical about a symmetry axis 71, and the symmetry axis 71 extends along a column direction Y, that is, active semiconductor layers 61 of pixel circuits of a red sub-pixel 211 and a green sub-pixel 212 located in the same row are symmetrical about the symmetry axis 71, and active semiconductor layers 61 of pixel circuits of a blue sub-pixel 213 and a green sub-pixel 212 located in the same row are symmetrical about the symmetry axis 71. It should be noted that each sub-pixel group 31 is also symmetrical about the symmetry axis 71.

Figure 8:
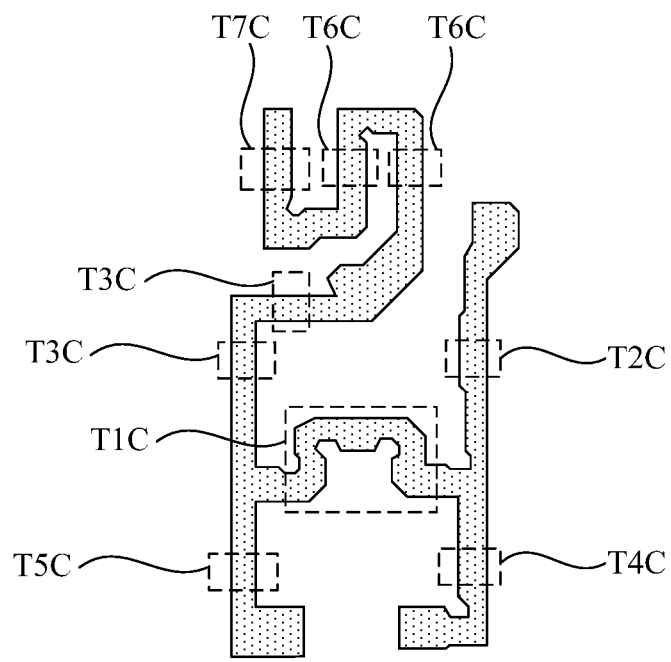
Figure 9:
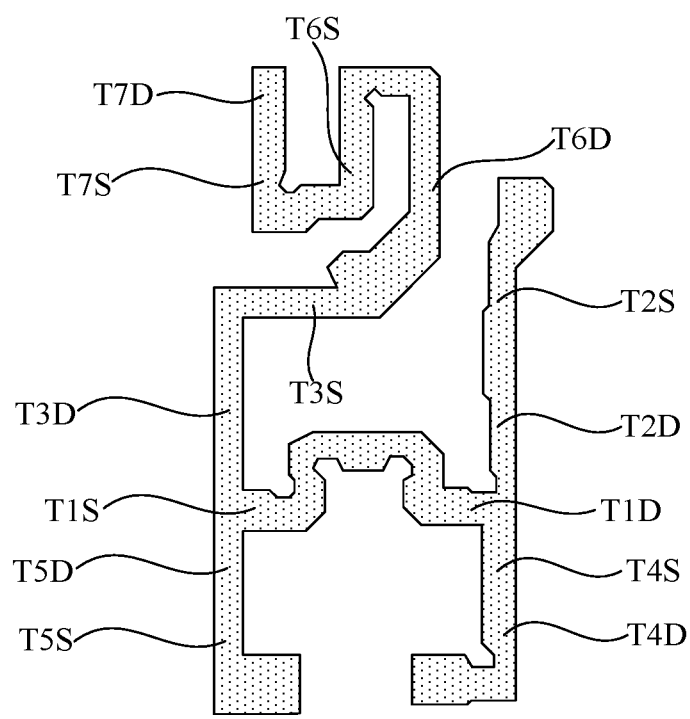
Figure 10:
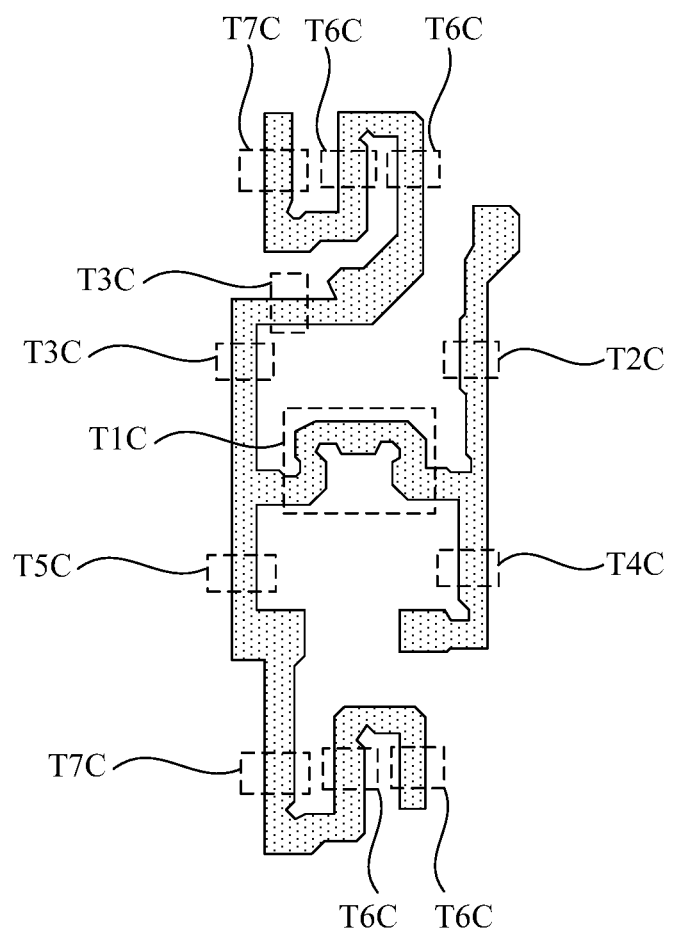
Figure 11:
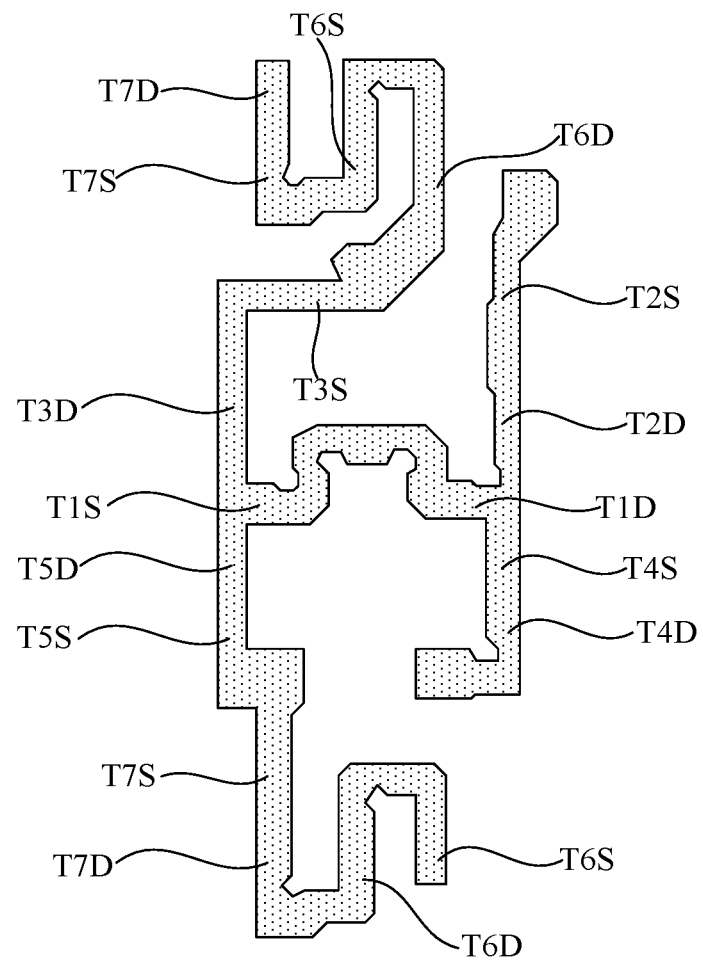

As shown in FIG. 7, in each sub-pixel group 31, active semiconductor layers 61 of pixel circuits of first-type sub-pixels 21 located in the same column are connected to one another. In each sub-pixel group 31, active semiconductor layers 61 of pixel circuits of two first-type sub-pixels 21 located in the same column have substantially the same structure, but also have different portions. For details, reference may be made to FIGS. 8 to 11. FIGS. 8 and 9 show a structure of an active semiconductor layer 61 of a pixel circuit of a red sub-pixel 211. FIGS. 10 and 11 show a structure of an active semiconductor layer 61 of a pixel circuit of a blue sub-pixel 213.

Figure 12:
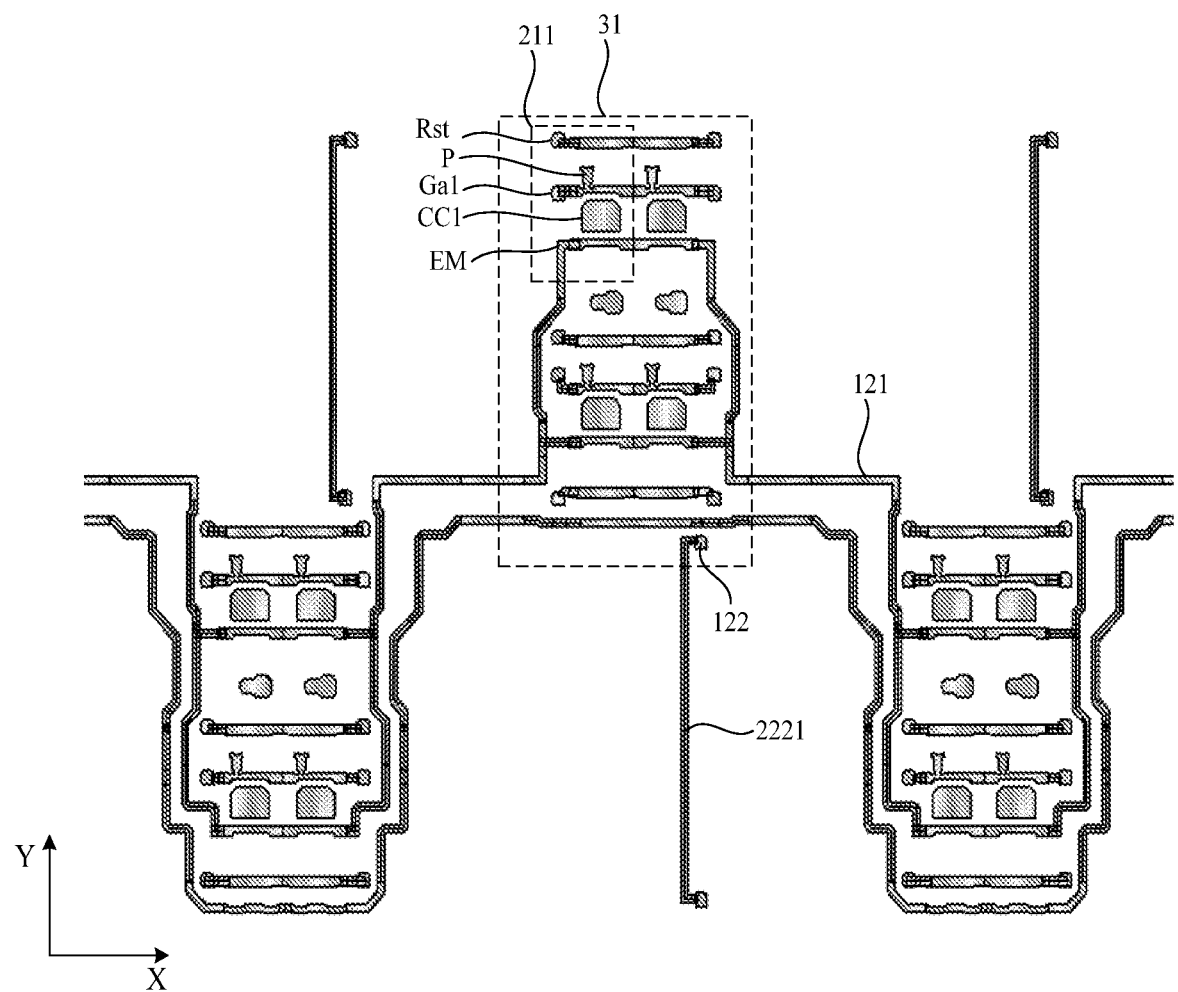

In this example, FIG. 12 shows a structure of a first conductive layer 121 in a pixel circuit. The first conductive layer 121 is located on a gate insulation layer. The first conductive layer 121 is located on the gate insulation layer and insulated from an active semiconductor layer 61. As shown in FIG. 12, the first conductive layer 121 may include a first electrode CC1 of a storage capacitor C, a first scan signal line Ga1, a reset control signal line Rst, a light emission control signal line EM, and a first vertical conductive portion 2221, and the first conductive layer 121 may include gate electrodes of a drive transistor T1, a data writing transistor T2, a threshold compensation transistor T3, a second light emission control transistor T4, a first light emission control transistor T5, a first reset transistor T6, and a second reset transistor T7. The first electrode CC1 of the storage capacitor C is also the gate electrode of the drive transistor T1.

As shown in FIG. 12, the gate electrode of the data writing transistor T2 may be a portion where the first scan signal line Ga1 overlaps the active semiconductor layer 61; the gate electrode of the second light emission control transistor T4 may be a first portion where the light emission control signal line EM overlaps the active semiconductor layer 61, and the gate electrode of the first light emission control transistor T5 may be a second portion where the light emission control signal line EM overlaps the active semiconductor layer 61; the gate electrode of the first reset transistor T6 is a first portion where the reset control signal line Rst overlaps the active semiconductor layer 61, and the gate electrode of the second reset transistor T7 is a second portion where the reset control signal line Rst overlaps the active semiconductor layer 61; the threshold compensation transistor T3 may be a thin film transistor with a double-gate structure, a first gate electrode of the threshold compensation transistor T3 may be a portion where the first scan signal line Ga1 overlaps the active semiconductor layer 61, and a second gate electrode of the threshold compensation transistor T3 may be a portion where a protrusion P protruding from the first scan signal line Ga1 overlaps the active semiconductor layer 61.

As shown in FIG. 12, the first vertical conductive portion 2221 extends along a column direction Y, and constitutes a part of a second-type power line 222. The first vertical conductive portion 2221 includes connecting portions 122 for connecting with other portions of power lines through via holes.

Figure 13:
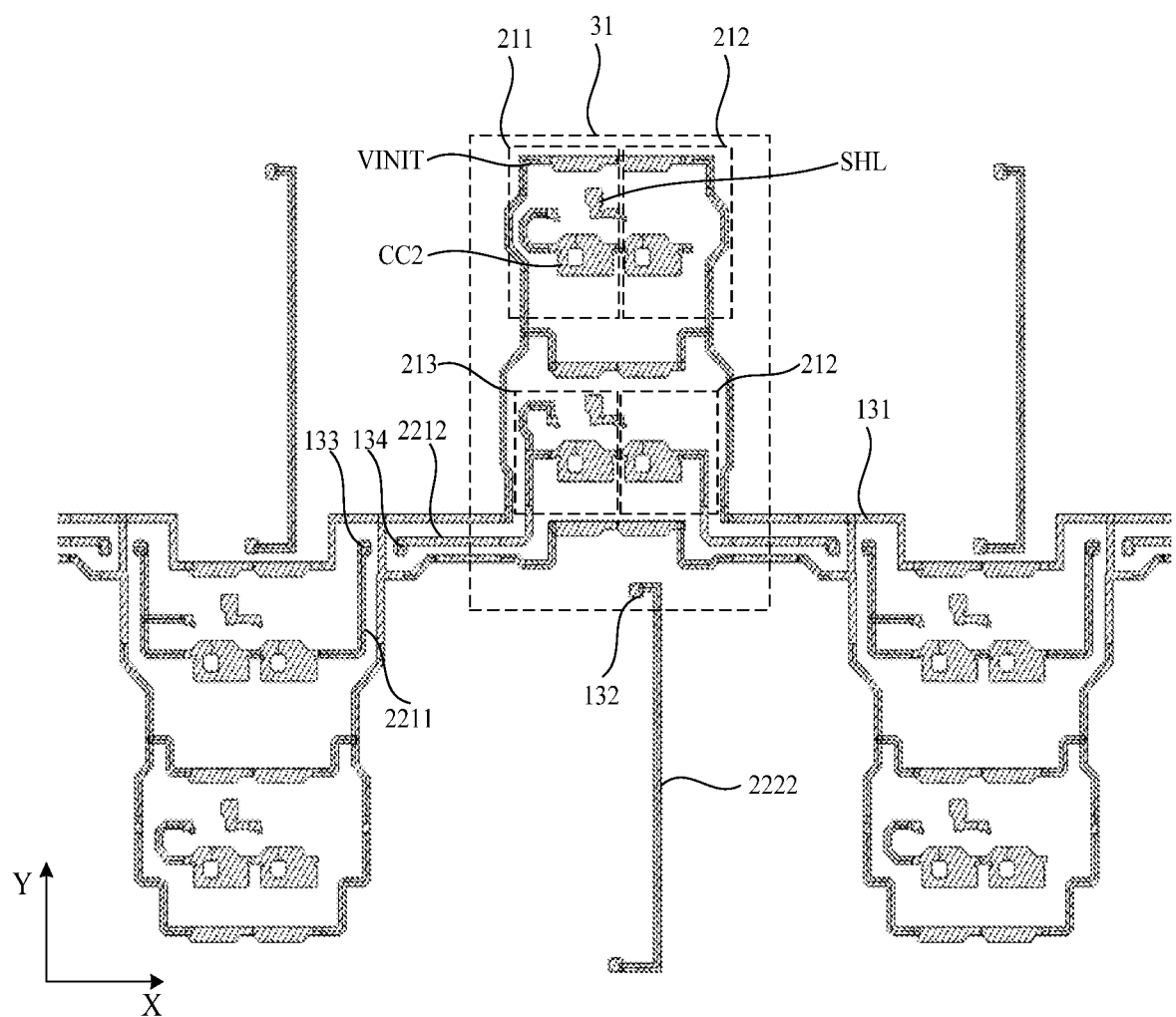

In this example, FIG. 13 shows a structure of a second conductive layer 131 in a pixel circuit. As shown in FIG. 13, the second conductive layer 131 includes a reset signal line VINIT, a second electrode CC2 of a storage capacitor C, a second vertical conductive portion 2222, a first horizontal conductive portion 2211, a second horizontal conductive portion 2212, and a light shielding portion SHL. Reset signal lines VINIT of pixel circuits of all first-type sub-pixels 21 are connected together. The second electrode CC2 is connected to a power line, for example, a second electrode CC2 in a red sub-pixel 211 may be a part of a first conductive portion E1 of a third-type power line 223, a second electrode CC2 in a blue sub-pixel 213 is a part of another first conductive portion E1 of the third-type power line 223, the second electrode CC2 in the blue sub-pixel 213 is also connected to the second horizontal conductive portion 2212, the second horizontal conductive portion 2212 and the first horizontal conductive portion 2211 are parts of a first-type power line 221, and the second vertical conductive portion 2222 is a part of a second-type power line 222. The light shielding portion SHL is used for shielding light to prevent a double-gate transistor from being optically disturbed. The light shielding portion SHL may be connected to a DC power supply, so that the light shielding portion SHL can play an electrical shielding role to prevent the double-gate transistor from being electrically disturbed.

It should be noted that a horizontal conductive portion does not refer to that the conductive portion extends along a row direction X, but is used to be connected with pixel circuits of first-type sub-pixels 21 arranged along the row direction X. A vertical conductive portion may refer to that the conductive portion extends along a column direction Y.

As shown in FIG. 13, the second vertical conductive portion 2222 includes connecting portions 132 for connecting with other portions of power lines through via holes. The first horizontal conductive portion 2211 includes a connecting portion 133 for connecting with the second horizontal conductive portion 2212 through a via hole, and the second horizontal conductive portion 2212 includes a connecting portion 134 for connecting with the first horizontal conductive portion 2211 through a via hole.

Figure 14:
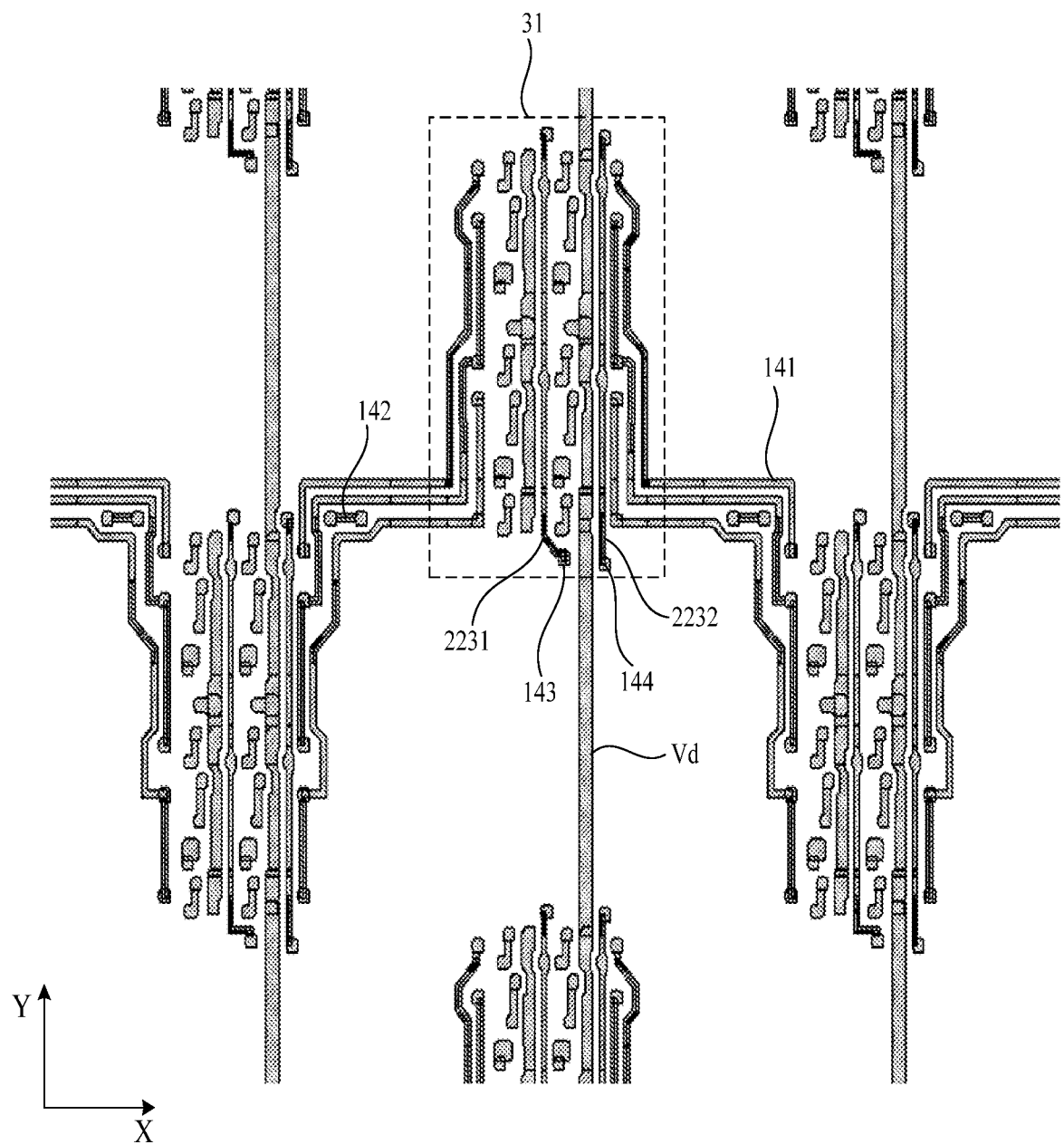

In this example, FIG. 14 shows a structure of a third conductive layer 141 in a pixel circuit. As shown in FIG. 14, the third conductive layer 141 includes a data line Vd, a third vertical conductive portion 2231, a fourth vertical conductive portion 2232, and connecting portions 142. The third vertical conductive portion 2231 and the fourth vertical conductive portion 2232 extend along a column direction Y respectively. The third vertical conductive portion 2231 and the fourth vertical conductive portion 2232 are second conductive portions E2.

Figure 15:
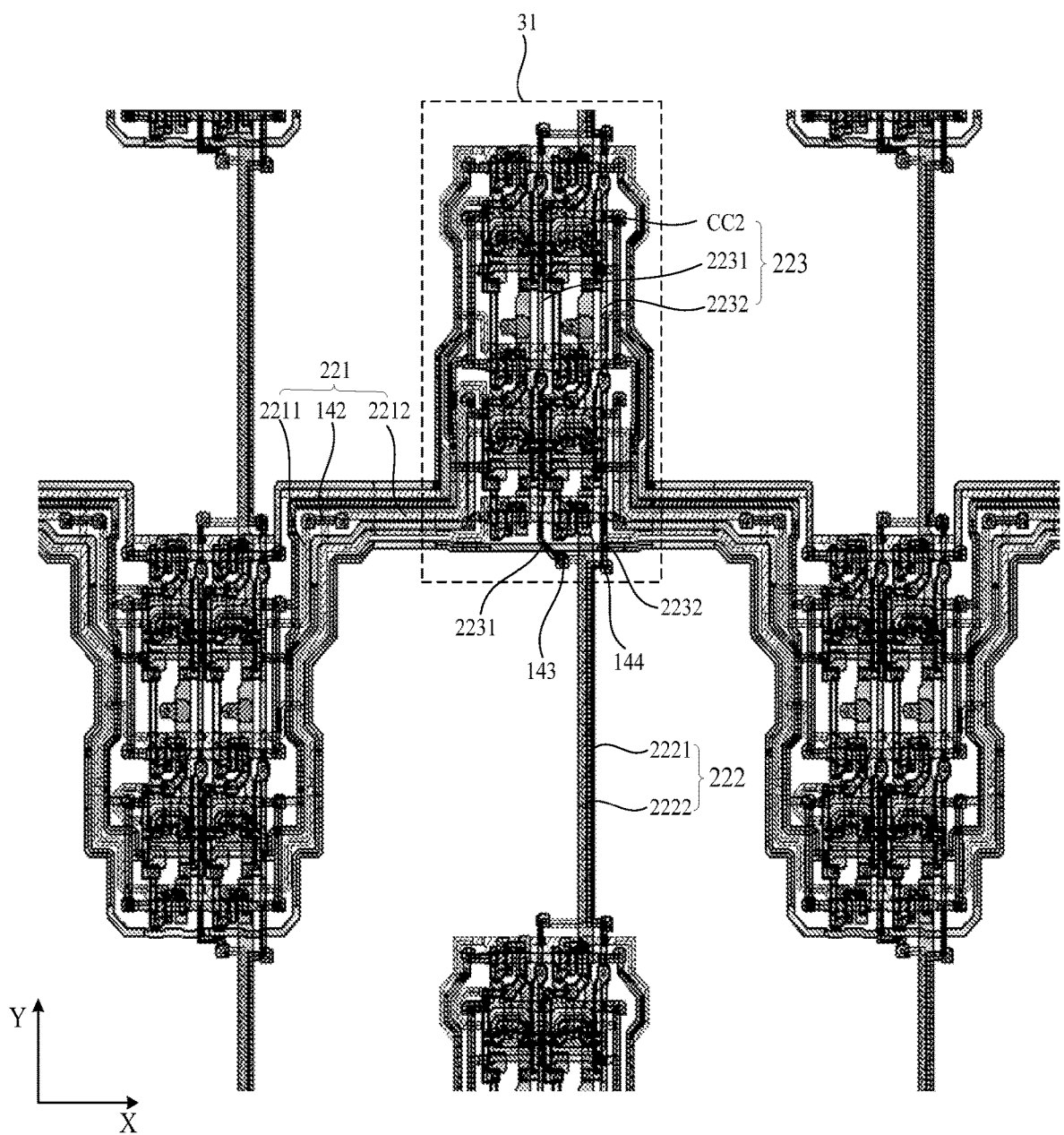
FIG. 15 is a schematic structural diagram illustrating power lines according to an example of the present disclosure.

In this example, as shown in FIG. 15, the third vertical conductive portion 2231 and the fourth vertical conductive portion 2232 are respectively connected to a second electrode CC2 through via holes to realize a ring-shaped structure of a third-type power line 223.

In this example, as shown in FIGS. 14 to 15, the third vertical conductive portion 2231 includes a connecting portion 143, where the connecting portion 143 is connected to a connecting portion 132 of the second vertical conductive portion 2222 through a via hole, and the fourth vertical conductive portion 2232 includes a connecting portion 144, where the connecting portion 144 is connected to a connecting portion 122 of the first vertical conductive portion 2221 through a via hole, so as to realize the connection between a third-type power line 223 and a second-type power line 222.

In this example, as shown in FIGS. 14 to 15, the connecting portions 142 are respectively connected to a connecting portion 133 of the first horizontal conductive portion 2211 and a connecting portion 134 of the second horizontal conductive portion 2212 through via holes to form a first-type power line 221.

Figure 16:
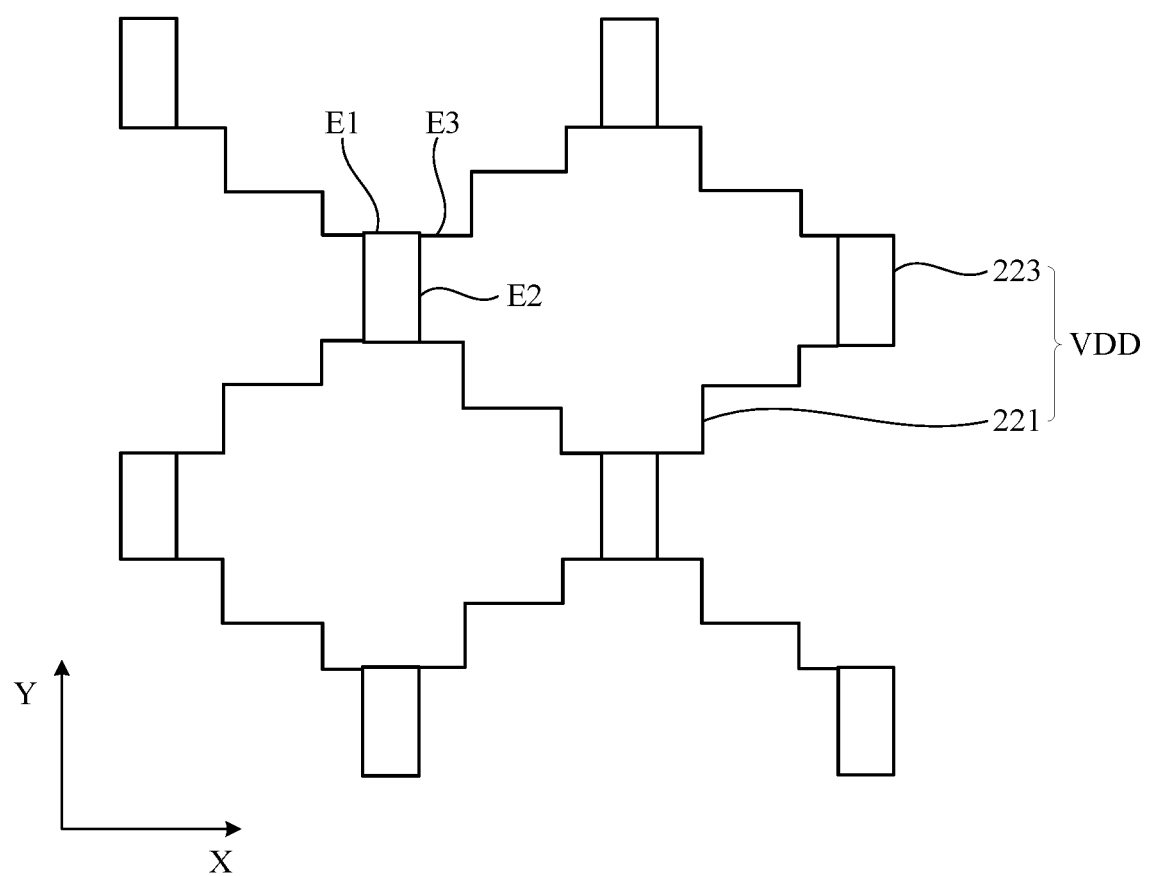
FIG. 16 is a schematic structural diagram illustrating another display substrate according to an example of the present disclosure.
Figure 17:
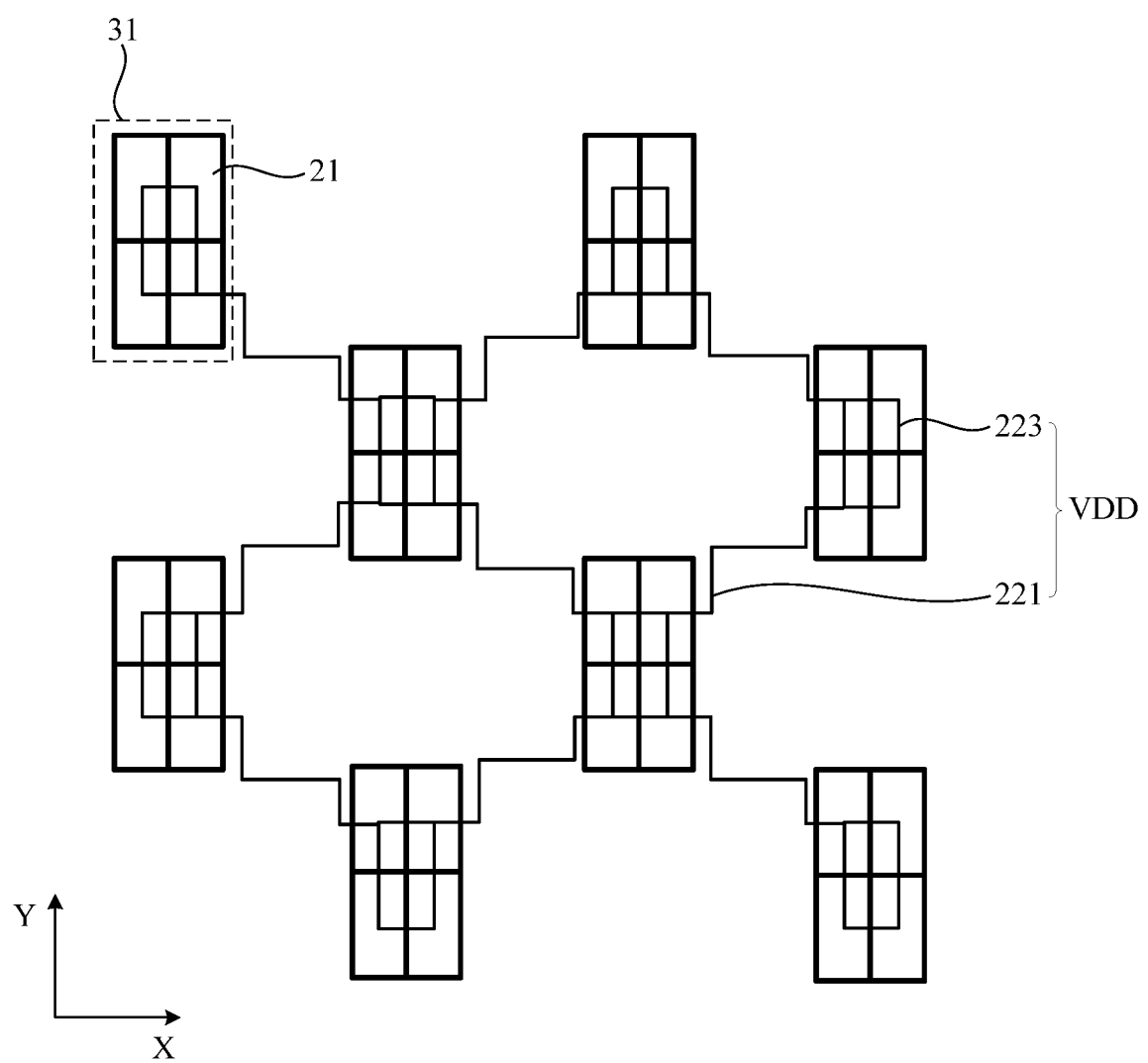
FIG. 17 is a schematic structural diagram illustrating another display substrate according to an example of the present disclosure.

An example of the present disclosure provides a display substrate. As shown in FIGS. 16 to 17, different from the above examples, in this example, a plurality of power lines 22 include only first-type power lines 221 and third-type power lines 223, but do not include second-type power lines 222, that is, a number of the second-type power lines 222 is 0, and a density of the first-type power lines 221 is higher than that in the above examples.

In this example, as shown in FIGS. 16 and 17, a first-type power line 221 exists between pixel circuits of first-type sub-pixels 21 in sub-pixel groups 31 in two adjacent rows, and the pixel circuits of the first-type sub-pixels 21 in the sub-pixel groups 31 in two adjacent rows are connected to the same first-type power line 221, that is, pixel circuits of first-type sub-pixels 21 in four adjacent rows are connected to the same first-type power line 221. Also, pixel circuits of first-type sub-pixels 21 in the same sub-pixel group 31 are connected to two adjacent first-type power lines 221.

In this example, as shown in FIGS. 16 and 17, each third-type power line 223 includes two first conductive portions E1, and the first conductive portions E1 extend along a row direction X. Each first-type power line 221 includes third conductive portions E3, and the third conductive portions E3 extend along the row direction X. First conductive portions of third-type power lines 223 are connected to third conductive portions of first-type power lines 221. A third-type power line 223 is respectively connected to two first-type power lines 221 through two first conductive portions.

In this example, a density of power lines in a first display sub-region 111 is smaller than that in a second display sub-region 112. Since the density of the power lines in the first display sub-region 111 is smaller than that in the second display sub-region 112, a light transmittance of the first display sub-region 111 can be improved.

Figure 18:
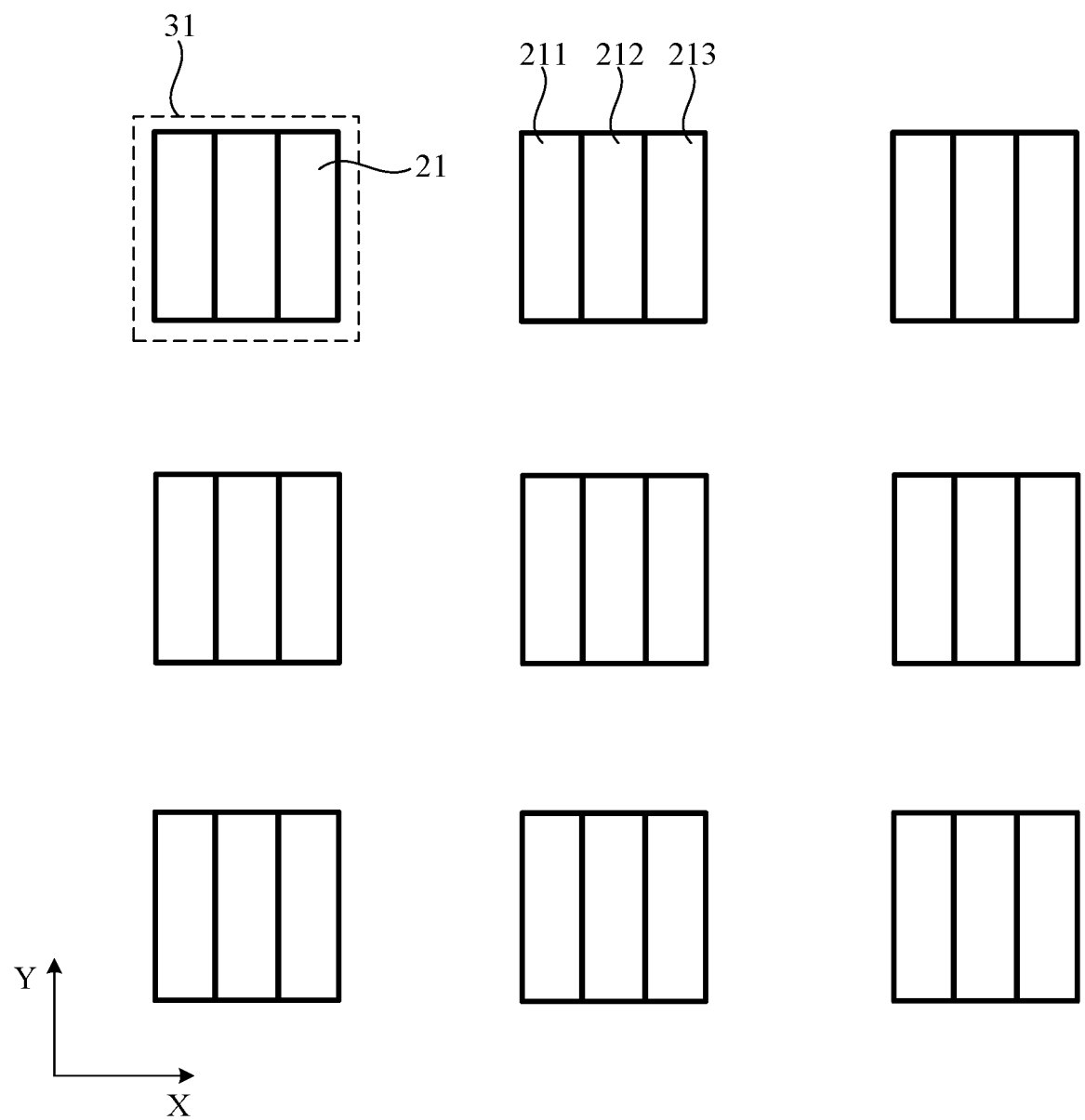
FIG. 18 is a schematic structural diagram illustrating another display substrate according to an example of the present disclosure.
Figure 19:
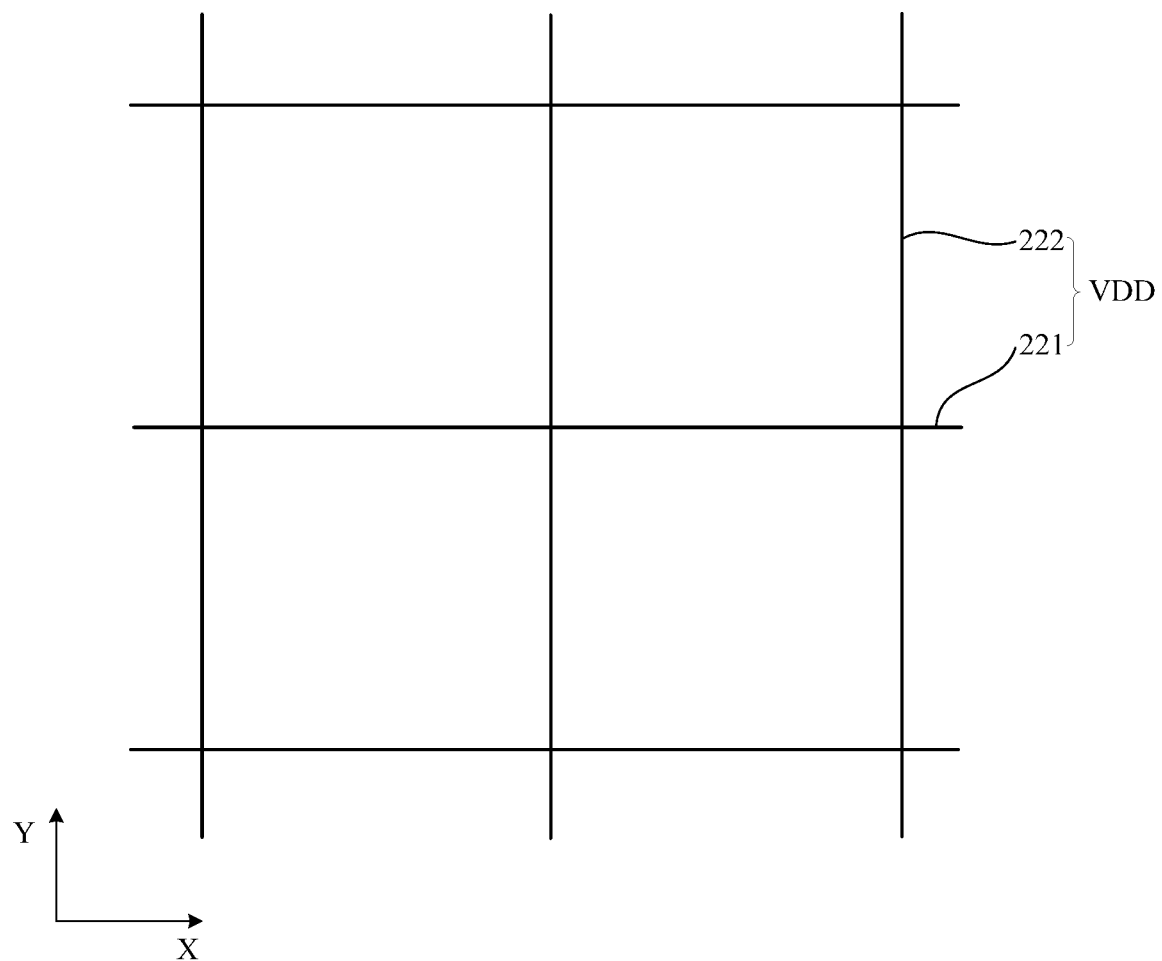
FIG. 19 is a schematic structural diagram illustrating another display substrate according to an example of the present disclosure.
Figure 20:
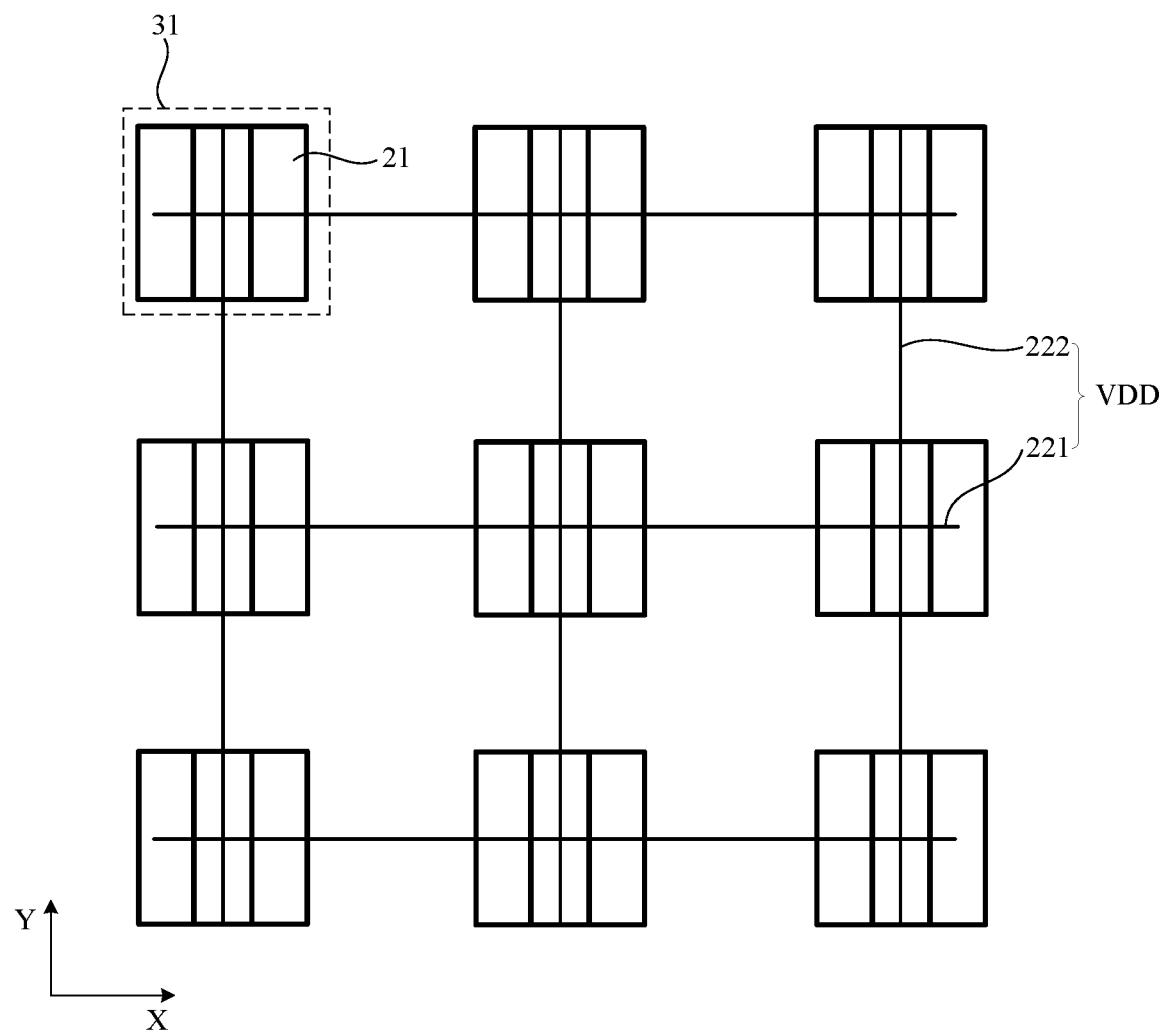
FIG. 20 is a schematic structural diagram illustrating another display substrate according to an example of the present disclosure.

An example of the present disclosure provides a display substrate. As shown in FIGS. 18 to 20, different from the above examples, each sub-pixel group 31 includes three adjacent first-type sub-pixels 21 in a row direction X.

In this example, as shown in FIG. 18, each sub-pixel group 31 includes adjacent red sub-pixel 211, green sub-pixel 212 and blue sub-pixel 213 in the row direction X.

In this example, a density of first-type sub-pixels 21 in a first display sub-region 111 is smaller than that of second-type sub-pixels in a second display sub-region 112. In this way, a light transmittance of the first display sub-region 111 can be improved.

In this example, as shown in FIGS. 19 and 20, a number of first-type power lines 221 is equal to a number of rows of the array. Pixel circuits of first-type sub-pixels 21 in sub-pixel groups 31 in the same row are connected to just the same first-type power line 221, and the same first-type power line 221 is connected to just pixel circuits of first-type sub-pixels 21 in sub-pixel groups 31 in the same row.

In this example, a number of second-type power lines 222 is smaller than a number of columns of the array. In this way, the number of second-type power lines 222 can be reduced, and the light transmittance of the first display sub-region 111 can be improved.

In this example, as shown in FIGS. 19 and 20, the number of second-type power lines 222 is equal to ⅓ times a number of columns of the array, and the number of second-type power lines 222 is equal to a number of columns of sub-pixel groups 31. For example, FIG. 20 shows 9 columns of first-type sub-pixels 21, 3 columns of sub-pixel groups 31, and the number of second-type power lines 222 is equal to 3.

In this example, as shown in FIGS. 19 and 20, pixel circuits of first-type sub-pixels 21 in sub-pixel groups 31 in the same column are connected to the same second-type power line 222, and the same second-type power line 222 is connected to pixel circuits of first-type sub-pixels 21 in sub-pixel groups 31 in the same column.

An example of the present disclosure provides a display device, which includes photosensitive elements, and further includes a display substrate according to any of the above examples. Projections of the photosensitive elements on the display substrate are located within a first display sub-region 111.

In this example, the photosensitive elements may be image sensors, ambient light sensors or distance sensors, but they are not limited thereto.

It should be noted that the display device in this example may be any product or component having a display function, such as electronic paper, a mobile phone, a tablet computer, a television, a notebook computer, a digital photo frame, or a navigator.

It should be pointed out that in the drawings, sizes of layers and areas may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference signs indicate similar elements throughout.

In the present disclosure, terms "first" and "second" are used only for descriptive purposes, and cannot be understood as indicating or implying relative importance. Terms "plurality" and "multiple" refer to two or more, unless expressly defined otherwise.

Other embodiments of the present disclosure will be readily apparent to those skilled in the art after considering the specification and practicing the contents disclosed herein. The present disclosure is intended to cover any variations, uses, or adaptations of the present disclosure, which follow the general principle of the present disclosure and include common knowledge or conventional technical means in the art that are not disclosed in the present disclosure. The specification and examples are to be regarded as illustrative only. The true scope and spirit of the present disclosure are pointed out by the following claims.

It is to be understood that the present disclosure is not limited to the precise structures that have described and shown in the drawings, and various modifications and changes can be made without departing from the scope thereof. The scope of the disclosure is to be limited only by the appended claims.

The invention claimed is:

1. A display substrate, comprising:
a display region comprising a first display sub-region and a second display sub-region, wherein a light transmittance of the first display sub-region is higher than that of the second display sub-region;
the display substrate further comprising: a plurality of first-type sub-pixels and a plurality of power lines, wherein
the plurality of first-type sub-pixels and the plurality of power lines are located in the first display sub-region; the plurality of first-type sub-pixels are arranged in an array along a row direction and a column direction; a first-type sub-pixel comprises a light emitting element and a pixel circuit for driving the light emitting element to emit light; the plurality of power lines are connected to one another; the plurality of power lines comprise at least one type of first-type power lines or second-type power lines, the first-type power lines are configured to be connected to pixel circuits of the first-type sub-pixels arranged in the row direction, and the second-type power lines are configured to be connected to pixel circuits of the first-type sub-pixels arranged in the column direction; a sum of a number of the first-type power lines and a number of the second-type power lines is smaller than a sum of a number of rows and a number of columns of the array.

2. The display substrate according to claim 1, wherein the plurality of first-type sub-pixels are divided into a plurality of sub-pixel groups, and a sub-pixel group comprises at least one of: at least two adjacent first-type sub-pixels in the row direction or at least two adjacent first-type sub-pixels in the column direction.

3. The display substrate according to claim 2, wherein a sub-pixel group comprises two adjacent first-type sub-pixels in the row direction and two adjacent first-type sub-pixels in the column direction.

4. The display substrate according to claim 3, wherein, in a same row of sub-pixel groups, a distance between two adjacent sub-pixel groups is higher than or equal to a width of the sub-pixel group in the row direction;
in a same column of sub-pixel groups, a distance between two adjacent sub-pixel groups is higher than or equal to a length of the sub-pixel group in the column direction.

5. The display substrate according to claim 3, wherein orthographic projections of sub-pixel groups in an $(i+2)^{th}$ row on sub-pixel groups in an $i^{th}$ row are located outside orthographic projections of sub-pixel groups in an $(i+1)^{th}$ row on the sub-pixel groups in the $i^{th}$ row, orthographic projections of sub-pixel groups in an $(i+3)^{th}$ row on the sub-pixel groups in the $i^{th}$ row overlaps the orthographic projections of sub-pixel groups in the $(i+1)^{th}$ row on the sub-pixel groups in the $i^{th}$ row, and the orthographic projections of sub-pixel groups in the $(i+3)^{th}$ row on the sub-pixel groups in the $i^{th}$ row are located outside the orthographic projections of sub-pixel groups in the $(i+2)^{th}$ row on the sub-pixel groups in the $i^{th}$ row, where i is a positive integer;
orthographic projections of sub-pixel groups in a $(j+2)^{th}$ column on sub-pixel groups in a $j^{th}$ column are located outside orthographic projections of sub-pixel groups in a $(j+1)^{th}$ column on the sub-pixel groups in the $j^{th}$ column, orthographic projections of sub-pixel groups in a $(j+3)^{th}$ column on the sub-pixel groups in the $j^{th}$ column overlaps the orthographic projections of sub-pixel groups in the $(j+1)^{th}$ column on the sub-pixel groups in the $j^{th}$ column, and the orthographic projections of sub-pixel groups in the $(j+3)^{th}$ column on the sub-pixel groups in the $j^{th}$ column are located outside the orthographic projections of sub-pixel groups in the $(j+2)^{th}$ column on the sub-pixel groups in the $j^{th}$ column, where j is a positive integer.

6. The display substrate according to claim 5, wherein the number of the first-type power lines is smaller than the number of rows of the array.

7. The display substrate according to claim 6, wherein the number of the first-type power lines is equal to 0.25 time the number of rows of the array, pixel circuits of first-type sub-pixels in a same sub-pixel group are connected to just a same first-type power line, and the same first-type power line is connected to pixel circuits of first-type sub-pixels in sub-pixel groups in two adjacent rows.

8. The display substrate according to claim 7, wherein the number of the second-type power lines is smaller than the number of columns of the array.

9. The display substrate according to claim 8, wherein the number of the second-type power lines is equal to 0.5 time the number of columns of the array, and the number of the second-type power lines is equal to a number of columns of the sub-pixel groups;
pixel circuits of first-type sub-pixels in sub-pixel groups in a same column are connected to a same second-type power line.

10. The display substrate according to claim 6, wherein a first-type power line exists between pixel circuits of first-type sub-pixels in sub-pixel groups in two adjacent rows, and the pixel circuits of the first-type sub-pixels in the sub-pixel groups in two adjacent rows are connected to a same first-type power line; pixel circuits of first-type sub-pixels in a same sub-pixel group are connected to two adjacent first-type power lines.

11. The display substrate according to claim 7, wherein the plurality of power lines further comprise third-type power lines, and the third-type power lines are connected to at least one type of the first-type power lines or the second-type power lines;
a number of the third-type power lines is the same as a number of the sub-pixel groups, and pixel circuits of first-type sub-pixels in a sub-pixel group are connected to a same third-type power line.

12. The display substrate according to claim 11, wherein the third-type power lines have a ring shape.

13. The display substrate according to claim 12, wherein when the third-type power lines are connected to the first-type power lines and the second-type power lines, the third-type power lines comprise first conductive portions and second conductive portions, the first conductive portions are connected to the second conductive portions, the first conductive portions extend along the row direction, and the second conductive portions extend along the column direction; the first-type power lines comprise third conductive portions, and the third conductive portions extend along the row direction; the second-type power lines extend along the column direction; the first conductive portions are connected to the third conductive portions, and the second-type power lines are connected to the first conductive portions or the second conductive portions;
when the third-type power lines are connected to the first-type power lines, the third-type power lines comprise first conductive portions, and the first conductive portions extend along the row direction; the first-type power lines comprise third conductive portions, and the third conductive portions extend along the row direction; the first conductive portions are connected to the third conductive portions.

14. The display substrate according to claim 2, wherein a sub-pixel group comprises three adjacent first-type sub-pixels in the row direction.

15. The display substrate according to claim 14, wherein the number of the first-type power lines is equal to the number of rows of the array;
pixel circuits of first-type sub-pixels in sub-pixel groups in a same row are connected to just a same first-type power line, and the same first-type power line is connected to just pixel circuits of first-type sub-pixels in sub-pixel groups in a same row.

16. The display substrate according to claim 15, wherein the number of the second-type power lines is smaller than the number of columns of the array.

17. The display substrate according to claim 16, wherein the number of the second-type power lines is equal to ⅓ times the number of columns of the array, and the number of the second-type power lines is equal to a number of columns of the sub-pixel groups;
pixel circuits of first-type sub-pixels in sub-pixel groups in a same column are connected to a same second-type power line, and the same second-type power line is connected to pixel circuits of first-type sub-pixels in sub-pixel groups in a same column.

18. The display substrate according to claim 1, wherein the second display sub-region comprises a plurality of second-type sub-pixels, and the plurality of second-type sub-pixels are arranged in an array along the row direction and the column direction;
a density of the first-type sub-pixels in the first display sub-region is smaller than a density of the second-type sub-pixels in the second display sub-region.

19. The display substrate according to claim 18, wherein the plurality of power lines further comprise fourth power lines and fifth power lines, the fourth power lines are configured to be connected to pixel circuits of the second-type sub-pixels arranged along the row direction, and the fifth power lines are configured to be connected to pixel circuits of the second-type sub-pixels arranged along the column direction;
a density of power lines in the first display sub-region is smaller than a density of power lines in the second display sub-region.

20. A display device, comprising a display substrate according to claim 1 and photosensitive elements, wherein projections of the photosensitive
elements on the display substrate are located within a first display sub-region.

* * * * *